United States Patent
Yang et al.

(10) Patent No.: US 11,133,207 B2
(45) Date of Patent: Sep. 28, 2021

(54) METHOD FOR FORMING FILMS ON WAFERS SEPARATED BY DIFFERENT DISTANCES

(71) Applicant: TAIWAN SEMICONDUCTOR MANUFACTURING CO., LTD., Hsinchu (TW)

(72) Inventors: Wen-Bin Yang, Hsinchu (TW); Feng-Yu Chen, Taichung (TW); Jian-Lun Lo, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 76 days.

(21) Appl. No.: 16/419,581

(22) Filed: May 22, 2019

(65) Prior Publication Data

US 2020/0075372 A1    Mar. 5, 2020

Related U.S. Application Data

(60) Provisional application No. 62/725,194, filed on Aug. 30, 2018.

(51) Int. Cl.
*C23C 16/458* (2006.01)
*H01L 21/673* (2006.01)
*H01L 21/67* (2006.01)

(52) U.S. Cl.
CPC .... *H01L 21/67309* (2013.01); *C23C 16/4583* (2013.01); *C23C 16/4587* (2013.01); *H01L 21/67017* (2013.01); *H01L 21/67098* (2013.01); *H01L 21/67313* (2013.01)

(58) Field of Classification Search
CPC .......................... C23C 16/4583; C23C 16/4587
See application file for complete search history.

(56) References Cited

U.S. PATENT DOCUMENTS 4,487,161 A * 12/1984 Hirata .................. C23C 16/507
                                                     118/500
4,566,839 A *  1/1986 Butler ............... H01L 21/67313
                                                     118/500

(Continued)

FOREIGN PATENT DOCUMENTS

| CN | 101399173 A | 4/2009 |
| KR | 10-2006-0098742 A | 9/2006 |
| TW | 200941633 A | 10/2009 |

OTHER PUBLICATIONS

Manawi, Yehia M., et al., "A Review of Carbon Nanomaterials' Synthesis via the Chemical Vapor Deposition (CVD) Method". Materials 2018, 11, 822, pp. 1-36. doi:10.3390/ma11050822.*

(Continued)

*Primary Examiner* — Bret P Chen
(74) *Attorney, Agent, or Firm* — Maschoff Brennan

(57) ABSTRACT

A method for forming a film is provided. The method includes sequentially placing a first wafer, a second wafer, and a third wafer in a chamber. The first wafer is separated from the second wafer by a first distance, the second wafer is separated from the third wafer by a second distance, and the first distance is smaller than the second distance. At least one process gas is introduced sequentially passing through the first wafer, the second wafer and the third wafer in the chamber.

20 Claims, 22 Drawing Sheets

(56) References Cited

U.S. PATENT DOCUMENTS

| | | | | |
|---|---|---|---|---|
| 4,947,784 | A | * | 8/1990 | Nishi ................ H01L 21/67781 414/404 |
| 5,188,499 | A | * | 2/1993 | Tarng ................ H01L 21/67781 118/500 |
| 5,423,503 | A | * | 6/1995 | Tanaka .............. H01L 21/67766 211/1.57 |
| 5,704,493 | A | * | 1/1998 | Fujikawa .......... H01L 21/67313 118/500 |
| 5,788,447 | A | * | 8/1998 | Yonemitsu ........ H01L 21/67103 414/217 |
| 6,053,980 | A | * | 4/2000 | Suda ................. H01L 21/67745 118/719 |
| 2006/0090849 | A1 | * | 5/2006 | Toyoda ................... C23C 16/54 156/345.32 |
| 2010/0129539 | A1 | * | 5/2010 | Higashisaka ..... H01L 21/67346 427/127 |
| 2011/0318489 | A1 | * | 12/2011 | Ishizu ............... H01L 21/67754 427/255.5 |
| 2012/0074463 | A1 | * | 3/2012 | Hata ................. H01L 31/03046 257/184 |
| 2018/0182652 | A1 | | 6/2018 | Seshimo et al. |

OTHER PUBLICATIONS

Yang, Yong, et al., "Influences of temperature gradient and distance on the morphologies of MoS2 domains". AIP Advances 8, 085218 (2018) pp. 1-10. https://doi.org/10.1063/1.5050652.*

Cheng, Hongbin, et al., "Effects of Precursor-Substrate Distances on the Growth of GaN Nanowires". Journal of Nanomaterials vol. 2015, Article ID 343541, pp. 1-6, http://dx.doi.org/10.1155/2015/343541.*

Kim, Youngwan, et al., "Selective Growth and Contact Gap-Fill of Low Resistivity Si via Microwave Plasma-Enhanced CVD". Micromachines 2019, 10, 689, pp. 1-8. doi:10.3390/mi10100689.*

Cheng, Hongbin, et al., "Effects of Precursor-Substrate Distances on the Growth of GaN Nanowires". Journal of Nanomaterials, vol. 2015, Article ID 343541, pp. 1-6.*

* cited by examiner

METHOD FOR FORMING FILMS ON WAFERS SEPARATED BY DIFFERENT DISTANCES

PRIORITY CLAIM AND CROSS-REFERENCE

This application claims priority to U.S. Provisional Application Ser. No. 62/725,194, filed Aug. 30, 2018, which is herein incorporated by reference.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. The uniformity of the layers deposited on the semiconductor substrate is affected and controlled by regulating process parameters such temperature of the wafer, reaction chamber pressure, flow path and rate of reactant gases, process time or duration, and other factors. It would be desirable to provide a solution for depositing layers for use in a wafer process apparatus.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
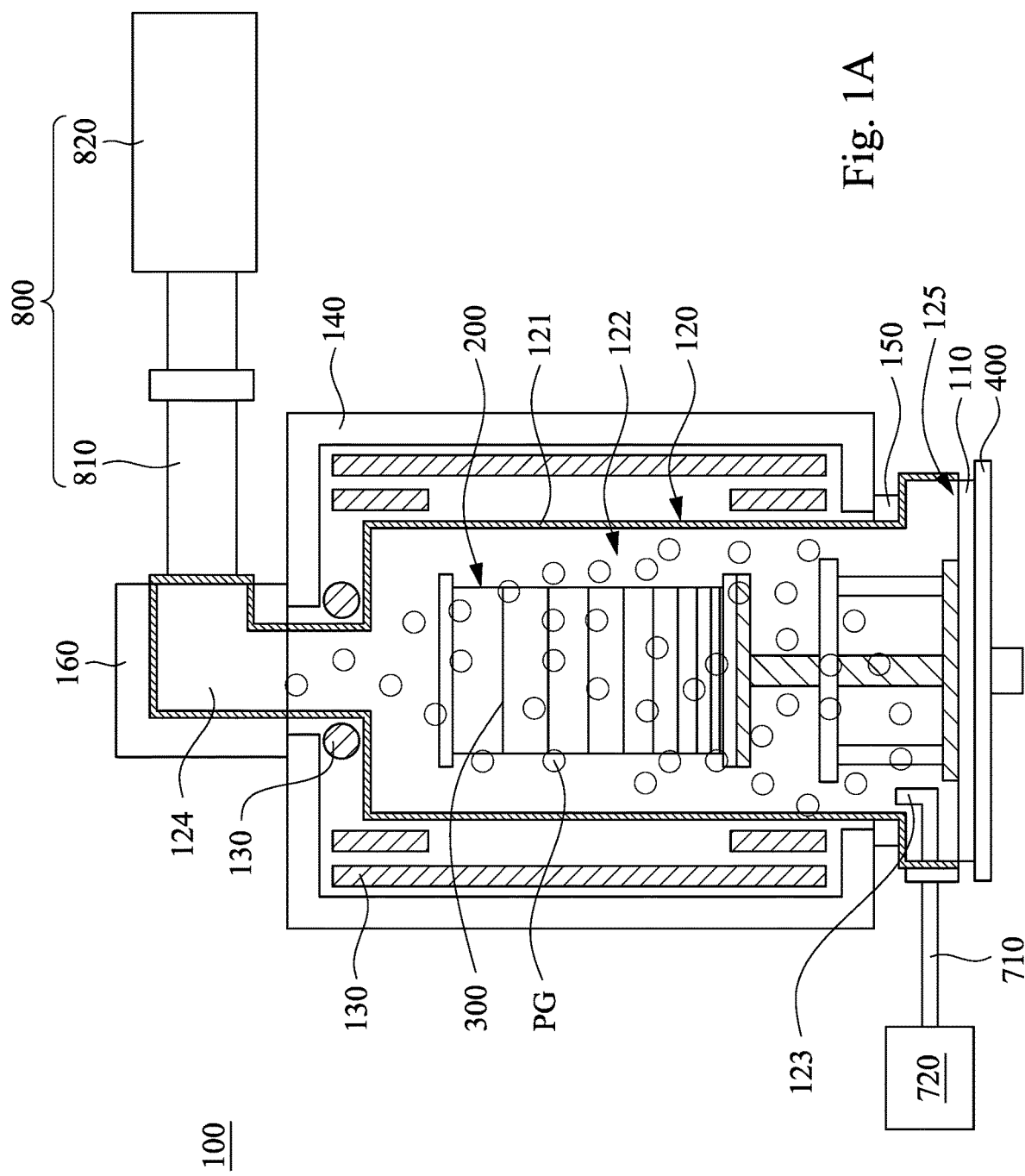
FIG. 1A is a schematic diagram showing a vertical furnace apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Chemical vapor deposition (CVD) processes are widely used to form layers of materials (e.g., nitride, oxide and polysilicon) on a semiconductor wafer. CVD processes may include transporting a reacting gaseous species to the surface, absorbing the gaseous species by the surface of the wafer, producing reaction products by heterogeneous surface reaction, and removing the gaseous reactants from the surface. A furnace, such as a chemical vapor deposition (CVD) process chamber, is used for depositing various films, such as polysilicon, silicon oxide, and silicon nitride films on a large number of semiconductor wafers at one time. However, a concentration ratio of process gas species in the furnace may vary at various positions, thus resulting in density variation of the thin films on the semiconductor wafers. The density variation of the thin films may result in etch resistance variation, which in turn will result in critical dimension (CD) deviations.

FIG. 1A is a schematic diagram showing a furnace apparatus 100 according to some embodiments of the present disclosure. The furnace apparatus 100 includes a lid plate 110, a processing vessel 120, a heater 130, and a shell 140. In the present embodiments, the lid plate 110 may support a wafer boat 200 that holds plural wafers 300. The processing vessel 120, which is also referred to as a "process tube", is made of quartz, and has an elongated shape. In some embodiments, the processing vessel 120 has a reaction body 121, a reaction chamber 122, a gas inlet 123, and a gas outlet 124. The reaction body 121 is made of a heat shielding material such as quartz. The reaction chamber 122 is formed in the reaction body 121. The reaction chamber 122 is for processing of the wafers 300 held by the wafer boat 200 that is supported on the lid plate 110 and contained in the reaction chamber 122. The gas inlet 123 is located at the bottom of the reaction body 121 in the present embodiments. Process gases PG are transported into the reaction chamber 122 via the gas inlet 123. For example, a gas supply source 720 is connected to the gas inlet 123 through a supply pipe 710. The gas outlet 124 is located at the top center of the reaction body 121 and used for distributing exhaust gases from the reaction chamber 122. For example, the gas outlet 124 is connected to an exhaust system 800 having an exhaust pipe 810 and a vacuum pump 820 capable of reducing a pressure.

In some embodiments, the lid plate 110 is removably mounted on the processing vessel 120. To be specific, the processing vessel 120 has an opening 125 at the lower end, and the lid plate 110 below the processing vessel 120 can be elevated by an elevating mechanism 400 in an up and down direction, such that the chamber 122 of the processing vessel 120 may be opened or closed by the movement of the lid plate 110. In further embodiments, by the downward movement of the lid plate 110, the wafer boat 200 is unloaded from the processing vessel 120 to a below loading area in which wafers are replaced. By the upward movement of the lid plate 110, the wafer boat 200 is loaded into the processing vessel 120.

In some embodiments, the heaters 130 surround the processing vessel 120 and may heat the processing vessel 120, thereby facilitate the reaction in the processing vessel 120. The shell 140 accommodate the processing vessel 120 and the heaters 130. In some embodiments, a heat-insulation member 150 is between a flange of the shell 140 and the processing vessel 120 for blocking a gap between the processing vessel 120 and the shell 140, thereby reducing heat loss.

During CVD processes carried out in the furnace apparatus 100, the wafer boat 200 is contained in the reaction chamber 122, and wafers 300 are processed in batches in order to maintain high wafer throughput. The process gases PG are introduced into the reaction chamber 122 through the gas inlet 123, and the wafers 300 are heated by the heaters 130 to facilitate deposition of chemical species from the process gases PG on to the wafers 300. The heating process may be performed before or during introducing the process gases PG. The wafers 300 may be heated to a temperature lower than a melting point of the chemical species for uniformly depositing the chemical species. After the deposition of chemical species, films are formed over the wafers 300, and exhaust gases are evacuated from the reaction chamber 122 through the gas outlet 124.

In some embodiments, for depositing silicon nitride on the wafers 300, a silicon-containing gas and a nitrogen-containing gas are employed as the process gases (also referred to as reactive gas) PG and are introduced into the reaction chamber 122 through one or more the gas inlets 123. For example, the silicon-containing gas may be silane ($SiH_4$), silicon chloride ($SiCl_4$), dichlorosilane ($SiH_2Cl_2$; DCS), or hexachloro disilane ($Si_2Cl_6$; HCD). The nitrogen-containing gas may be nitrogen (N2), or ammonia ($NH_3$).

However, since the process gases PG near the gas inlets 123 are more dense, the concentration of the process gases PG may vary at different positions in the reaction chamber 122. For example, the concentration of the silicon-containing gas at a lower position is higher than that at a higher position, and the concentration of the nitrogen-containing gas at a lower position is higher than that at a higher position. When silicon nitrides are deposited on the wafers 300 during the CVD process, due to the concentration variances of the silicon-containing gas and the nitrogen-containing gas, a depositing rate of the silicon nitride on a wafer at the lower position is higher than the depositing rate of the silicon nitride on a wafer at the higher position. The higher depositing rate of the silicon nitride may lower a density of the deposited silicon nitride. As such, a density of the deposited silicon nitride on the wafer at the lower position of the reaction chamber would be lower than the density of the deposited silicon nitride on the wafer at the higher position of the reaction chamber. In other words, the deposited silicon nitride on the wafer at the lower position of the reaction chamber is less dense than the deposited silicon nitride on the wafer at the higher position of the reaction chamber. The density variation of the deposited silicon nitride may result in etch rate differences in subsequent etching processes, and such etch rate differences may degrade critical dimension uniformity.

In the present embodiments, the wafer boat 200 is designed to hold the wafers non-uniformly, such that the pitches between the wafers may vary according to the position of the gas inlets 123. Through the configuration, the variance of the concentration of the silicon-containing gas and the concentration of the nitrogen-containing gas can be reduced, and a uniformity of the density of the deposited silicon nitride is improved.

Figure 1B:
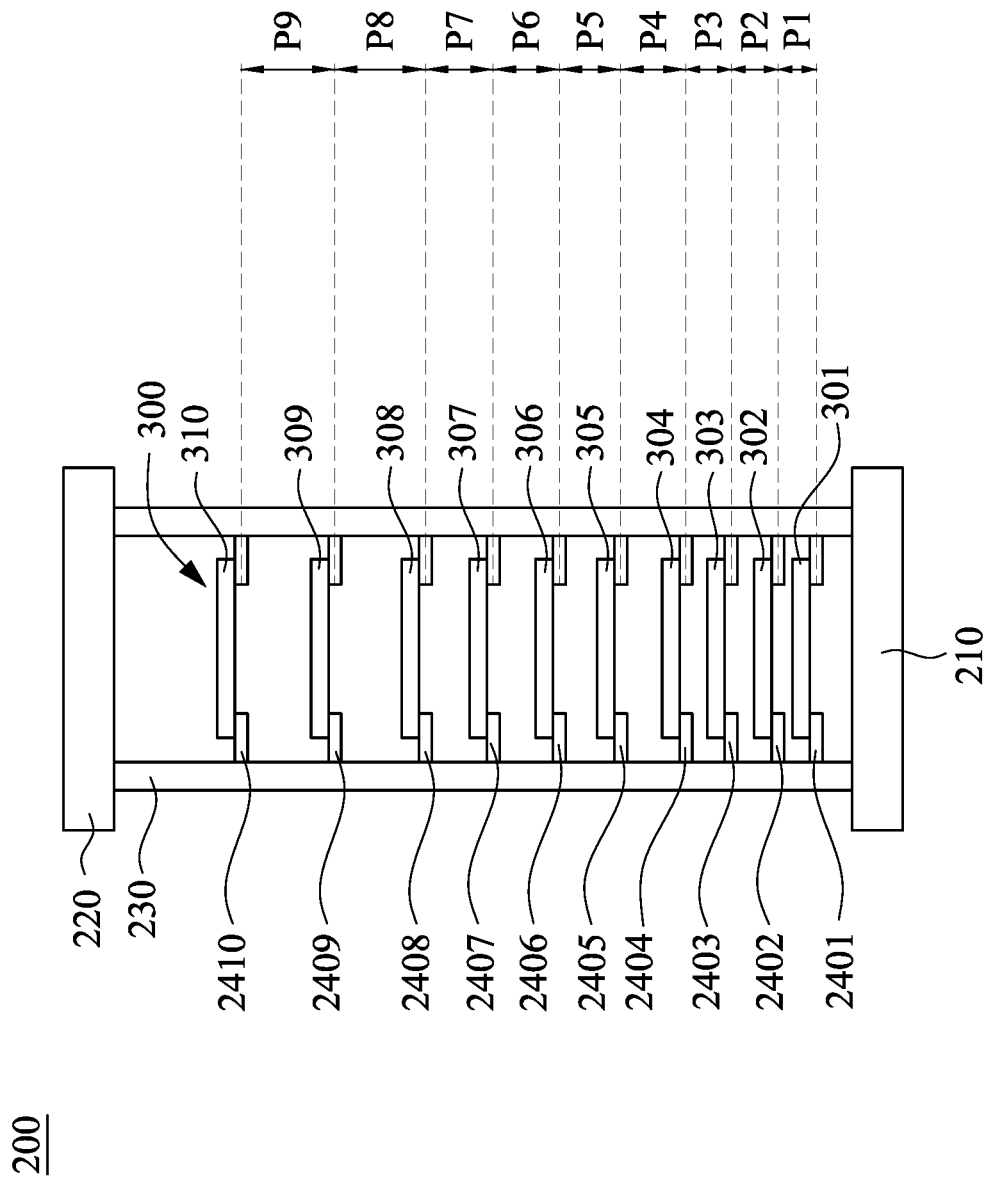
FIG. 1B is a schematic cross-sectional view of a wafer boat in the vertical furnace apparatus of FIG. 1A according to some embodiments of the present disclosure.

FIG. 1B is a schematic cross-sectional view of a wafer boat 200 in the vertical furnace apparatus of FIG. 1A according to some embodiments of the present disclosure. The wafer boat 200 includes a base plate 210, a top plate 220, support members 230 (such as support arms in the embodiments), and fixture members (such as support pins 2401-2410 in the embodiments) supported by the support members 230. The base plate 210 and top plate 220 are spanned by the support arms 230. The support pins 2401-2410 extend from each of the support arms 230, at substantially a 90-degree angle with respect to the longitudinal axis of the support arm 230. Each of wafers 301-310 is supported by a set of the support pins 2401-2410 that extend from the respective support arms 230, respectively. In present embodiments, each set of the support pins 2401-2410 is in contact with the bottom of each wafer 301-310. In present embodiments, each set of the support pins 2401-2410 are separated from each other, such that bottom surfaces of the wafers 301-310 may be exposed. In some embodiments, the wafer boat 200 is made of quartz, silicon carbide or silicon.

In present embodiments, as shown in FIG. 1B, the sets of the support pins 2401-2410 are separated from each other set by respective pitches P1-P9, such that the wafers 301-310 are separated from each other by the pitches P1-P9. The pitches P1-P9 between the wafers 301-310 may vary according to the position of the gas inlets 123 (referring to FIG. 1A) for reducing gas concentration variance and improving uniformity of the density of the deposited material (e.g., silicon nitrides). For example, the pitches P1-P9 increases from bottom to top. In some examples, the pitch P1 between the support pins 2401 and 2402 (i.e., the pitch P1 between the wafers 301 and 302) is smaller than the pitch P9 between the support pins 2409 and 2410 (i.e., the pitch P9 between the wafers 309 and 310). Through the configuration, during the CVD process, the silicon-containing gas and the nitrogen-containing gas are consumed more at the lower position than at the higher position, since the wafers at the lower position is denser than at the higher position. Therefore, the concentrations of the silicon-containing gas and the nitrogen-containing gas at the lower position are reduced, and the concentrations of the silicon-containing gas and the nitrogen-containing gas adjacent to the gas outlet 124 are increased. As such, the concentration variations of the silicon-containing gas and the nitrogen-containing gas at different positions in the reaction chamber 122 are reduced. Through the uniform concentration distribution, the depositing rates of the silicon nitrides on the wafers 301-310 may be similar, and density of the silicon nitrides on the wafers 301-310 may be similar.

In the present embodiments, the pitches P1-P9 may be different from each other. However, it should not limit the scope of the present disclosure. In some other embodiments, some of the pitches P1-P9 may be the same, while at least two of the pitches P1-P9 may be different, in which one of the pitches P1-P9 near the gas inlet is smaller than one of the pitches P1-P9 away from the gas inlet.

It is noted that the deposited material using the furnace apparatus 100 is not limited to silicon nitride, and in some other embodiments, the material deposited on the wafers by the furnace apparatus 100 may be polysilicon, silicon oxide, carbon-doped silicon nitride, silicon carbide oxynitride (SiCON), titanium nitride, or other suitable materials. In some embodiments, for depositing polysilicon, the process gas PG may include silane ($SiH_4$), disilane ($Si_2H_6$), trisilane ($Si_3H_8$) and/or dichlorosilane ($SiH_2Cl_2$). In some embodiments, for depositing silicon oxide, the process gas PG may include tetraethoxysilane ($Si(OC_2H_5)_4$). In some alternative embodiments, for depositing silicon oxide, the process gas PG may include tris(dimethylamino)silane (TDMS) and ozone ($O_3$). In some other embodiments, for depositing silicon oxide on the wafers, the process gas PG may include other suitable oxides. In some other embodiments, for depositing carbon-doped silicon nitride on the wafers, the process gas PG may include carbon-containing gas, silicon-containing gas, and nitrogen-containing gas, in which the carbon-containing gas may be a hydrocarbon compound, e.g., ethylene ($C_2H_6$), the silicon-containing gas may be silane ($SiH_4$), silicon chloride ($SiCl_4$), dichlorosilane ($SiH_2Cl_2$; DCS), or hexachloro disilane ($Si_2Cl_6$; HCD), and the nitrogen-containing gas may be nitrogen (N2), or ammonia ($NH_3$).

In some embodiments, for depositing SiCON, the process gas PG may include HCD, propene ($C_3H_6$), oxygen ($O_2$), and ammonia ($NH_3$). In some embodiments, for depositing titanium nitride, the process gas PG may include titanium tetrachloride ($TiCl_4$) and ammonia ($NH_3$).

Figure 1C:
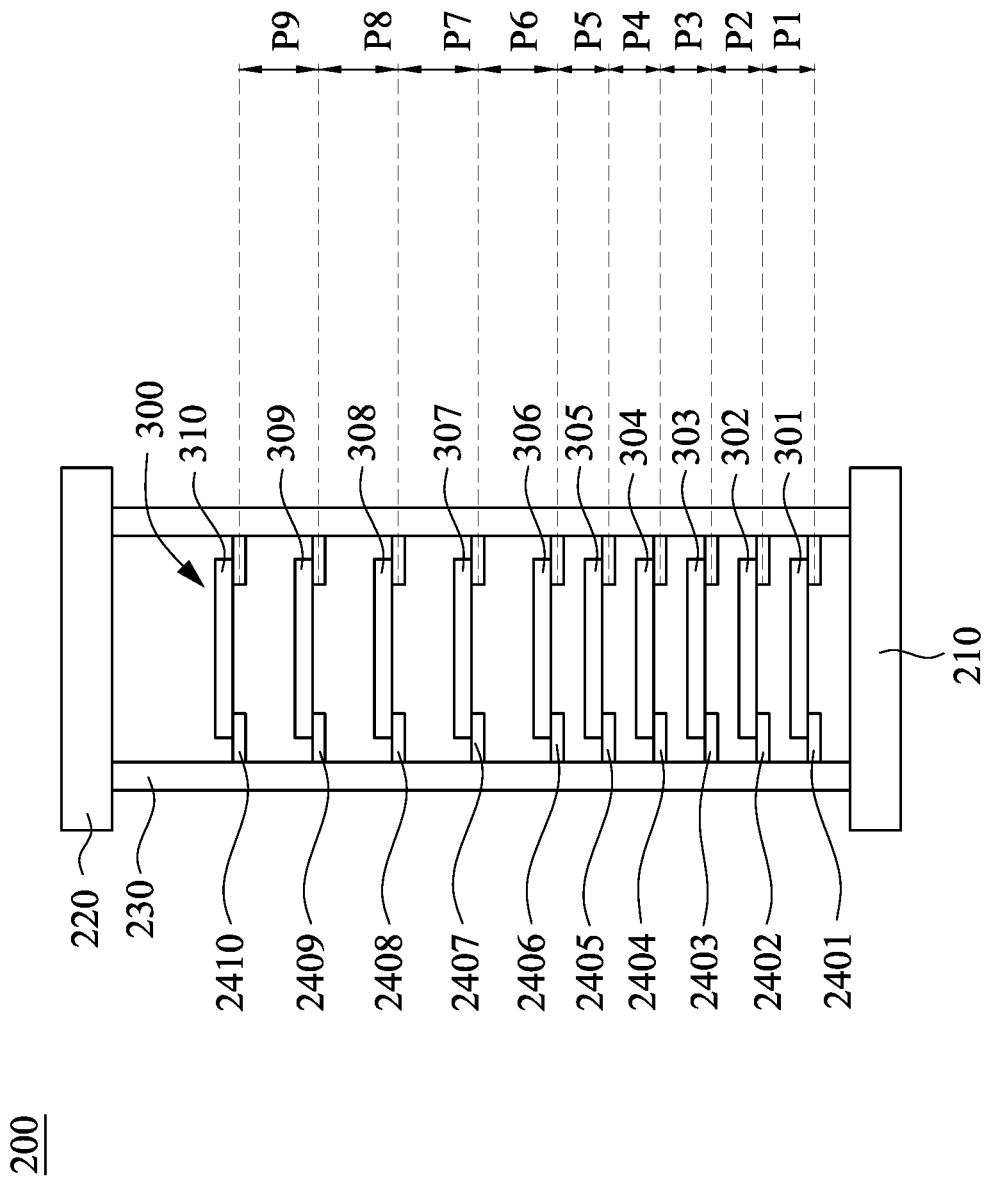
FIG. 1C is a schematic cross-sectional view of a wafer boat in a vertical furnace apparatus according to some embodiments of the present disclosure.

FIG. 1C is a schematic cross-sectional view of a wafer boat 200 in a vertical furnace apparatus according to some embodiments of the present disclosure. The present embodiments are similar to the embodiments of FIG. 1B, and the difference between the present embodiments and the embodiments of FIG. 1B is that the pitches P1-P4 may be substantially the same and smaller than the pitches P5-P9, which may be substantially the same. Other details of the present embodiments are similar to that of the embodiments of FIG. 1B, and not repeated herein.

Figure 2A:
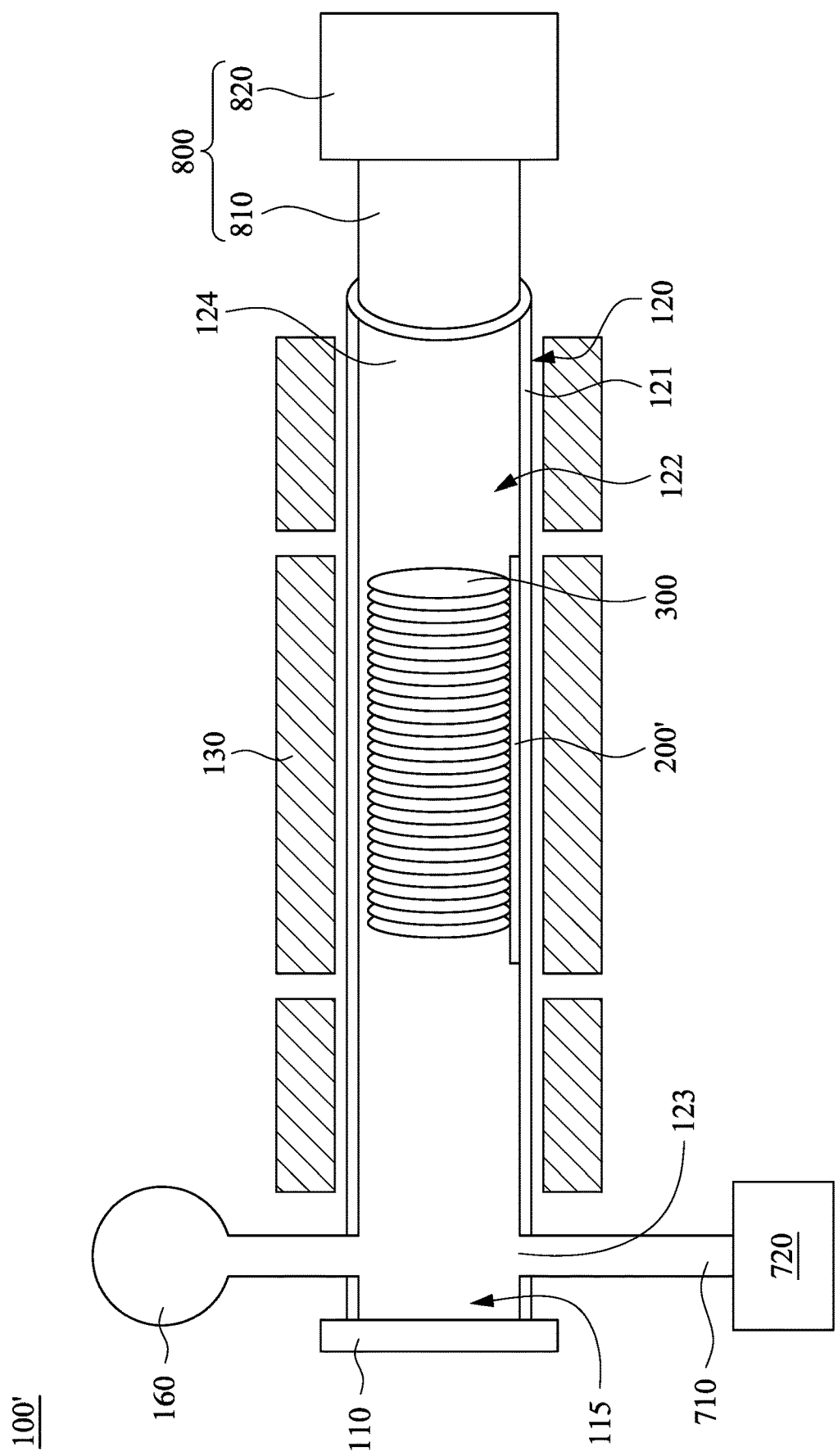
FIG. 2A is a schematic diagram showing a horizontal furnace apparatus according to some embodiments of the present disclosure.

FIG. 2A is a schematic diagram showing a horizontal furnace apparatus 100' according to some embodiments of the present disclosure. The horizontal furnace apparatus 100' includes a lid plate 110, a processing vessel 120, and a heater 130. The lid plate 110 is removably mounted on the processing vessel 120. The processing vessel 120 has a reaction body 121, a reaction chamber 122, a gas inlet 123, and a gas outlet 124. The reaction chamber 122 is for processing of the wafers 300 held by the wafer boat 200' and contained in the reaction chamber 122. In the present embodiments, the wafer boat 200' is not supported by the lid plate 110, but disposed on an inner wall of the reaction body 121. In some embodiments, the wafer boat 200' may be hold by a cantilever of the reaction body 121, and may not in direct contact with the inner wall of the reaction body 121. The gas inlet 123 is located at an end of the reaction body 121 in the present embodiments. Process gases are transported into the reaction chamber 122 via the gas inlet 123. For example, a gas supply source 720 is connected to the gas inlet 123 through a supply pipe 710 for providing the process gases. The gas outlet 124 is located at the other end of the reaction body 121 and used for distributing exhaust gases from the reaction chamber 122. For example, the gas outlet 124 is connected to an exhaust system 800 having an exhaust pipe 810 and a vacuum pump 820 capable of reducing a pressure.

In some embodiments, the furnace apparatus 100' may further include a pressure sensor 160 connected to the reaction chamber 122 for detecting a pressure of the gas in the reaction chamber 122. In some embodiments, the furnace apparatus 100' may further include a shell for accommodating the processing vessel 120 and the heater 130.

Figure 2B:
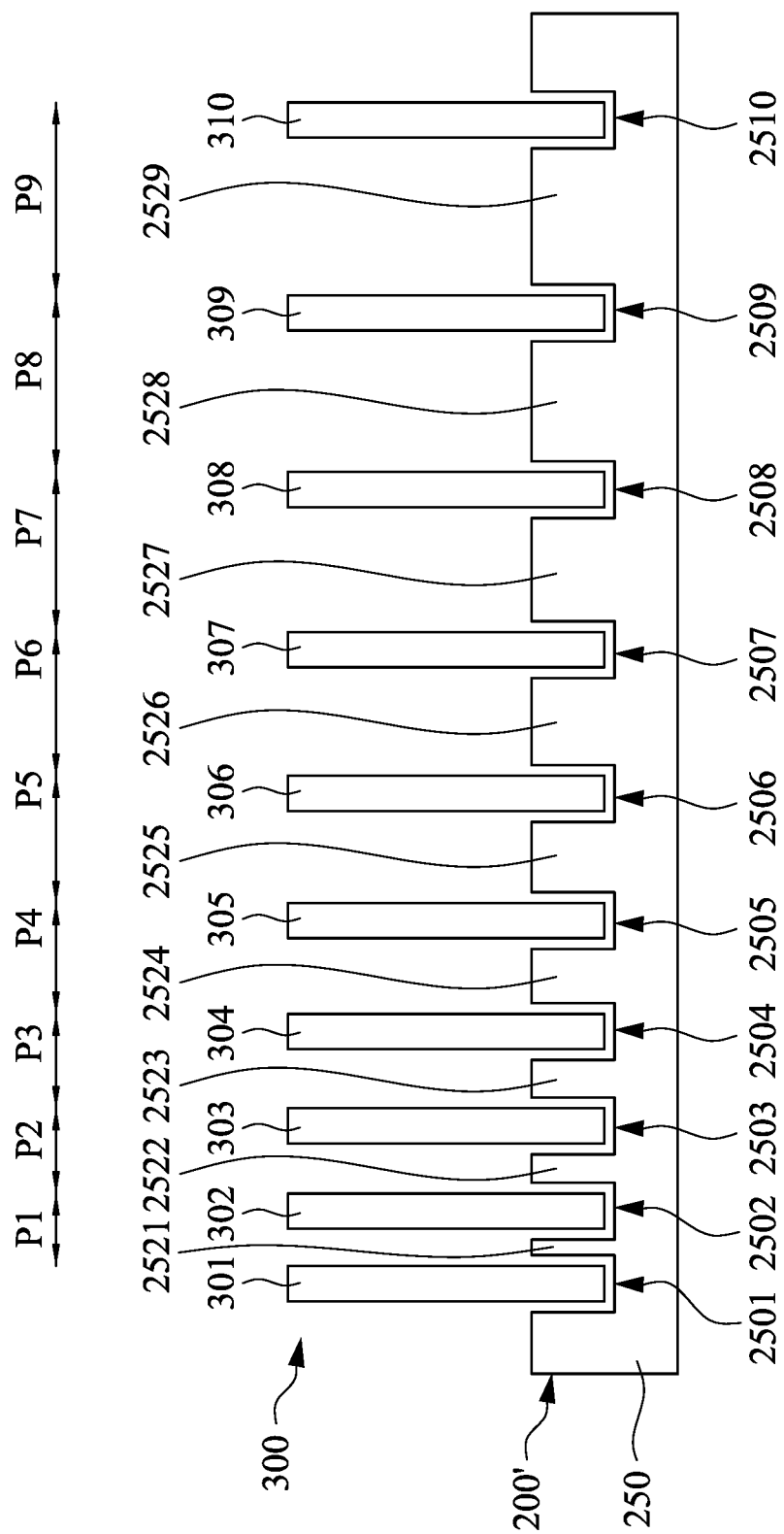
FIG. 2B is a schematic cross-sectional view of a wafer boat in the horizontal furnace apparatus of FIG. 2A according to some embodiments of the present disclosure.

FIG. 2B is a schematic cross-sectional view of a wafer boat 200' in the horizontal furnace apparatus 100' of FIG. 2A according to some embodiments of the present disclosure. The wafer boat 200' includes a support member (e.g., a support plate 250 in the present embodiments) and plural fixture members (e.g., slots 2501-2510 in the present embodiments) on the support plate 250. Each of the fixture members (e.g., slots 2501-2510 in the present embodiments) is for receiving at least a portion of a peripheral edge of each of the wafers 301-310. The slots 2501-2510 have substantially the same depth and width for holding the wafers having the same thickness. As aforementioned, the wafer boat 200' may be made of quartz, silicon carbide or silicon.

In the present embodiments, the slots 2501-2510 are separated from each other set by the pitches P1-P9, and the pitches P1-P9 may vary according to the position of the gas inlets 123 (referring to FIG. 2A). Through the configuration, the pitches P1-P9 between the wafers 301-310 may vary according to the position of the gas inlets 123 (referring to FIG. 2A) for reducing gas concentration variance and improving uniformity of the density of the deposited material (e.g., silicon nitrides). Portions 2521~2529 of the support member 250 between each slot may be referred to as post in some embodiments. Correspondingly, the portions 2521~2529 have different widths for spacing the wafers 301-310 with the different pitches P1-P9. In some embodiments, the portions 2521~2529 of the support member 250 may have a teeth-shaped to fix the position of the wafers 301-310.

For example, the pitches P1-P9 increase from the gas inlet 123 to the gas outlet 124 (referring to FIG. 2A). In some examples, the pitch P1 between the slots 2501 and 2502 (i.e., the pitch P1 between the wafer 301 and 302) is smaller than the pitch P9 between the slots 2509 and 2510 (i.e., the pitch P9 between the wafer 309 and 310). Through the configuration, during the CVD process, since the wafers adjacent to the gas inlet 123 is denser than that adjacent to the gas outlet 124, the silicon-containing gas is consumed more at a position adjacent to the gas inlet 123 (referring to FIG. 2A). Therefore, the concentrations of the silicon-containing gas and the nitrogen-containing gas adjacent to the gas inlet 123 are reduced, and the concentrations of the silicon-containing gas and the nitrogen-containing gas adjacent to the gas outlet 124 are increased. As such, the concentration variations of the silicon-containing gas and the nitrogen-containing gas at different positions in the reaction chamber 122 are reduced. Therefore, the depositing rates of the silicon nitrides on the wafers 301-310 may be similar, and density of the silicon nitrides on the wafers 301-310 may be similar. Other details of the present embodiments are similar to those in the embodiments of FIG. 1A, and not repeated herein.

In the present embodiments, the pitches P1-P9 may be different from each other. However, it should not limit the scope of the present disclosure. In some other embodiments, some of the pitches P1-P9 may be the same, while at least two of the pitches P1-P9 may be different, in which one of the pitches P1-P9 near the gas inlet is smaller than one of the pitches P1-P9 away from the gas inlet.

Figure 2C:
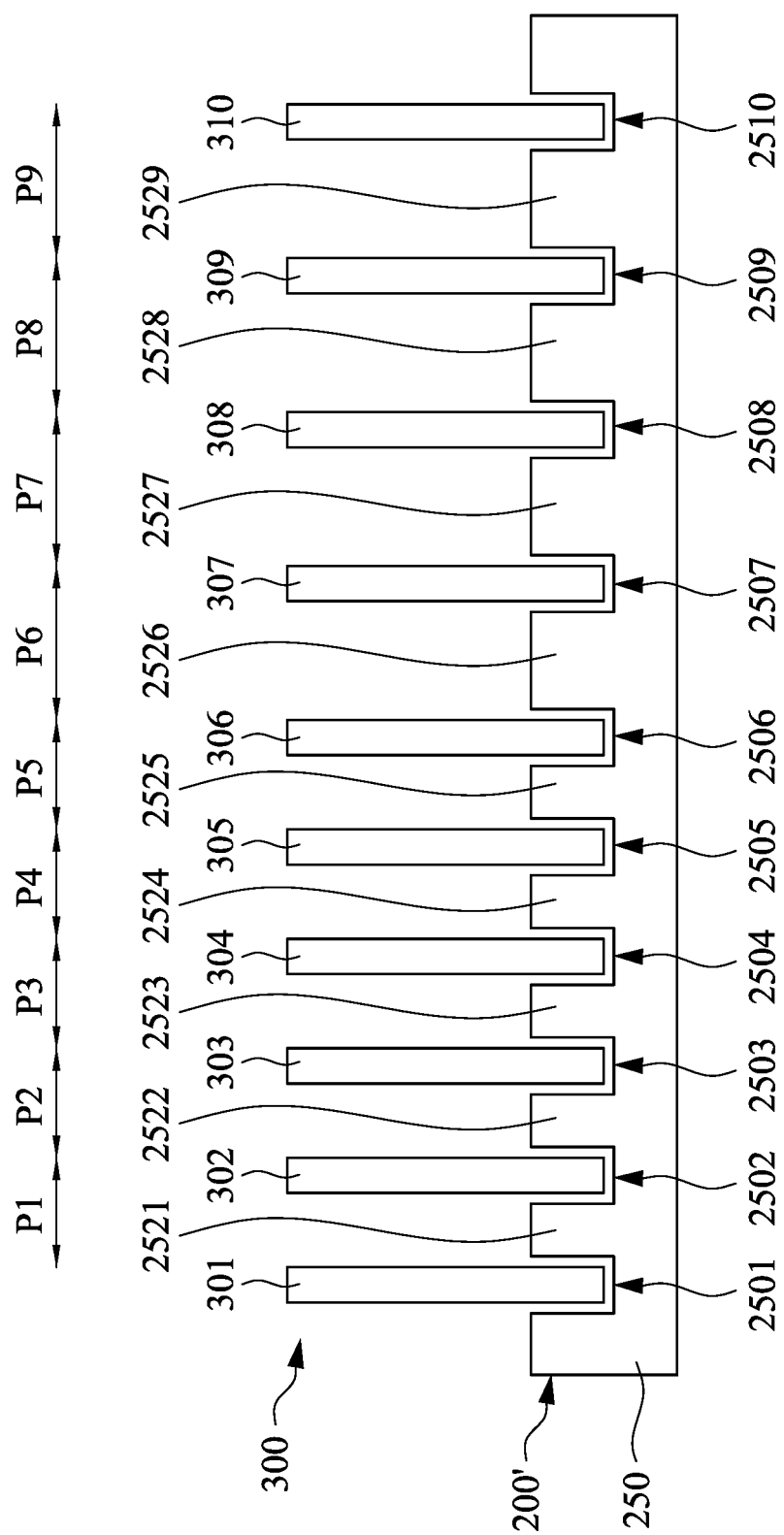
FIG. 2C is a schematic cross-sectional view of a wafer boat in a horizontal furnace apparatus according to some embodiments of the present disclosure.

FIG. 2C is a schematic cross-sectional view of a wafer boat 200' in a horizontal furnace apparatus according to some embodiments of the present disclosure. The present embodiments are similar to the embodiments of FIG. 2B, and the difference between the present embodiments and the embodiments of FIG. 2B is that the pitches P1-P4 may be substantially the same and smaller than the pitches P5-P9, which may be substantially the same. Correspondingly, the portions 2526-2529 of the support member 250 have the same width greater than a width of the portions 2521-2525 of the support member 250. Other details of the present embodiments are similar to that of the embodiments of FIG. 2B, and not repeated herein.

Figure 2D:
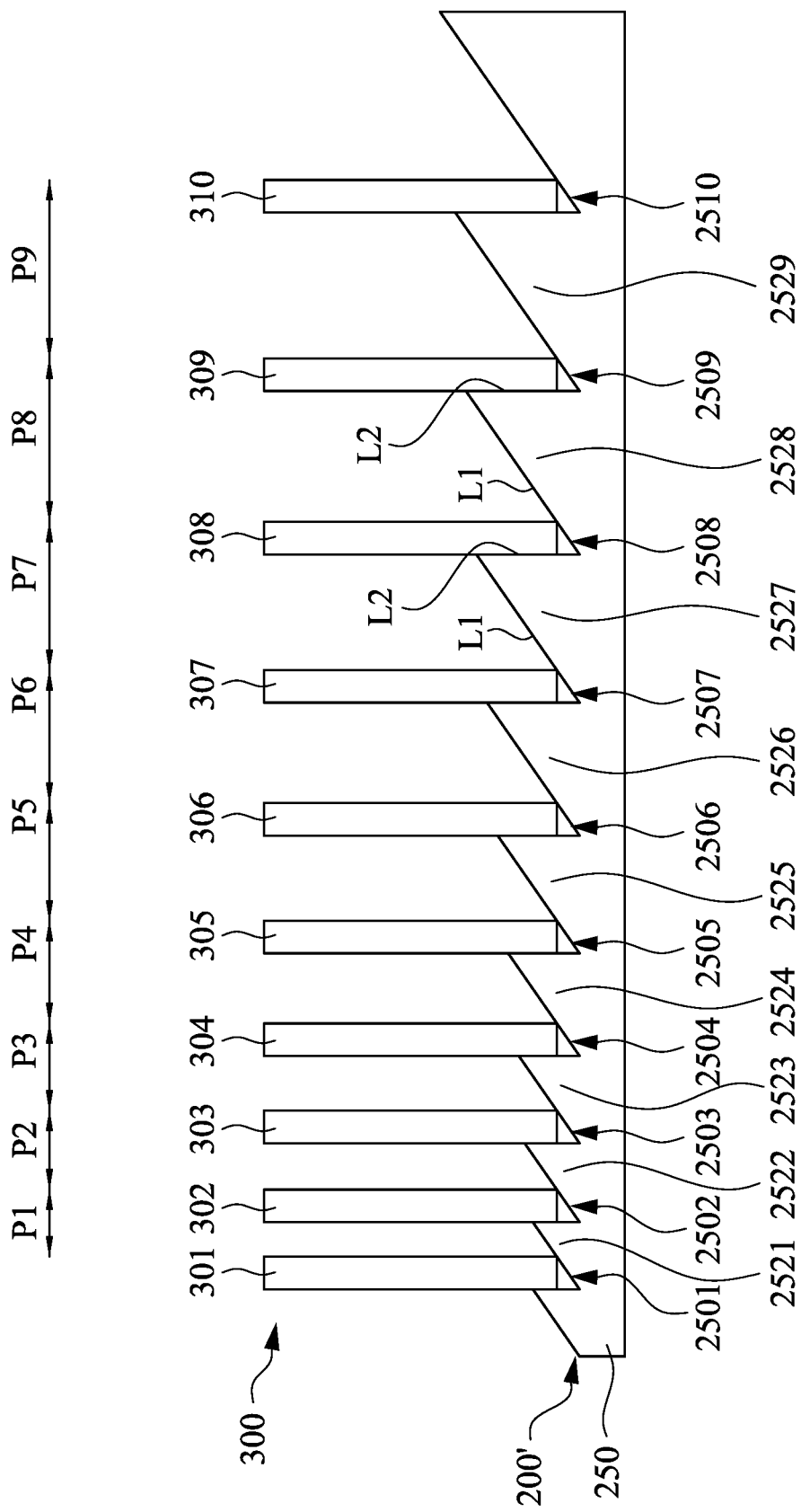
FIG. 2D is a schematic cross-sectional view of a wafer boat in a horizontal furnace apparatus according to some embodiments of the present disclosure.

FIG. 2D is a schematic cross-sectional view of a wafer boat in a horizontal furnace apparatus according to some embodiments of the present disclosure. The present embodiments are similar to the embodiments of FIG. 2B, and the difference between the present embodiments and the embodiments of FIG. 2B is that each of the portions 2521~2529 of the support member 250 has a teeth-shaped with sidewalls L1 and L2. The sidewalls L1 may be inclined with respect to the sidewall L2, such that the position of the wafers may be fixed by the sidewalls L1 and L2 of adjacent two portions 2521~2529. Other details of the present embodiments are similar to that of the embodiments of FIG. 2B, and not repeated herein.

Figure 3A:
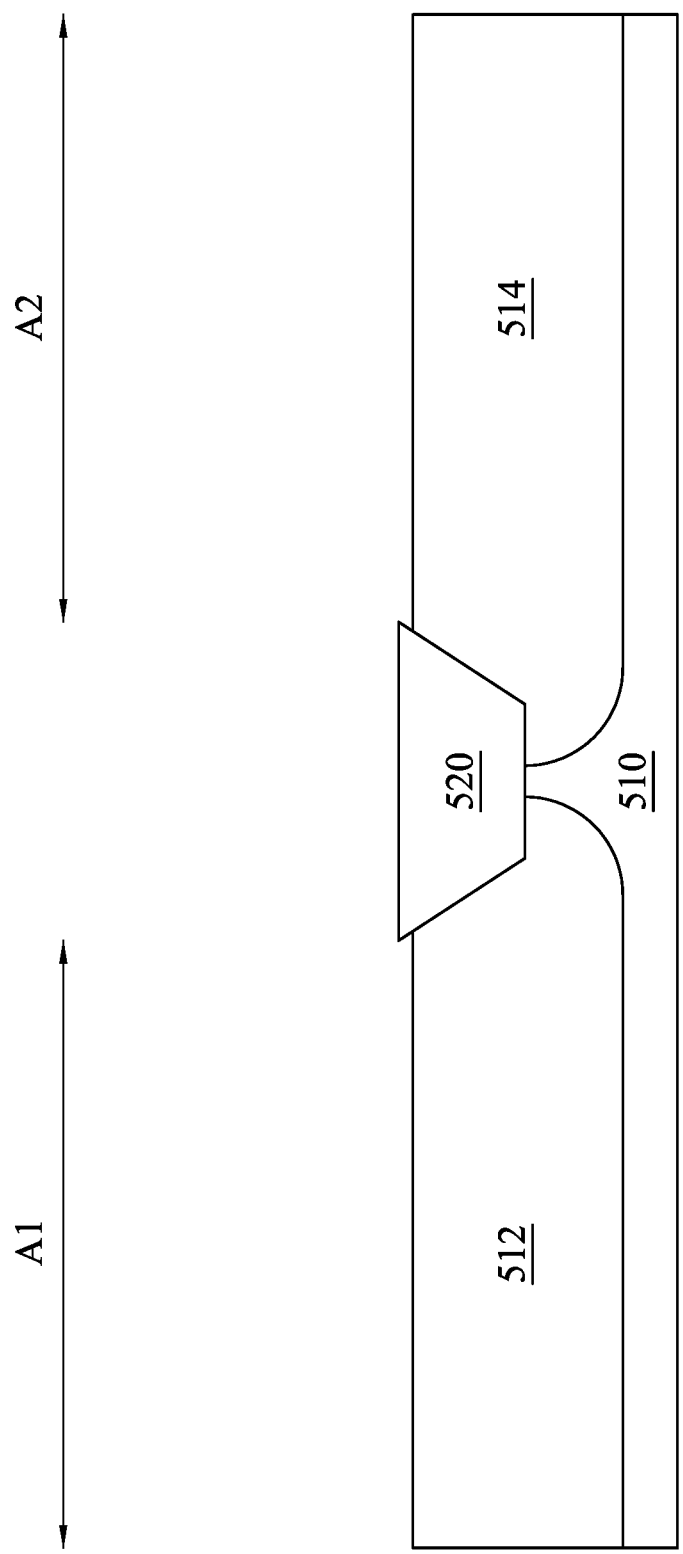
FIGS. 3A-3M are cross-sectional views of a semiconductor device at various intermediate stages of manufacture according to some embodiments of the present disclosure.

FIGS. 3A-3M are cross-sectional views of a semiconductor device at various intermediate stages of manufacture according to some embodiments of the present disclosure. Reference is made to FIG. 3A. A semiconductor substrate 510 is provided and isolation structures 520 are formed to define active regions in the substrate. The isolation structures 520 may be formed using standard shallow trench isolation processes, for example, comprising the steps of etching trenches, and filling the trenches with a filling dielectric material. The filling dielectric material may be silicon oxide, for example. FIG. 3A shows two active regions: a first active region A1 where a n-type transistor is to be formed, and a second active region A2 where a p-type transistor is to be formed. Ion implantation may be performed to form well regions 512 and 514 in the first and second active regions A1 and A2, respectively. These well regions 512 and 514 might be of different conductivity types. For example, the well regions are a p-type well region 512 and a n-type well region 514.

Figure 3B:
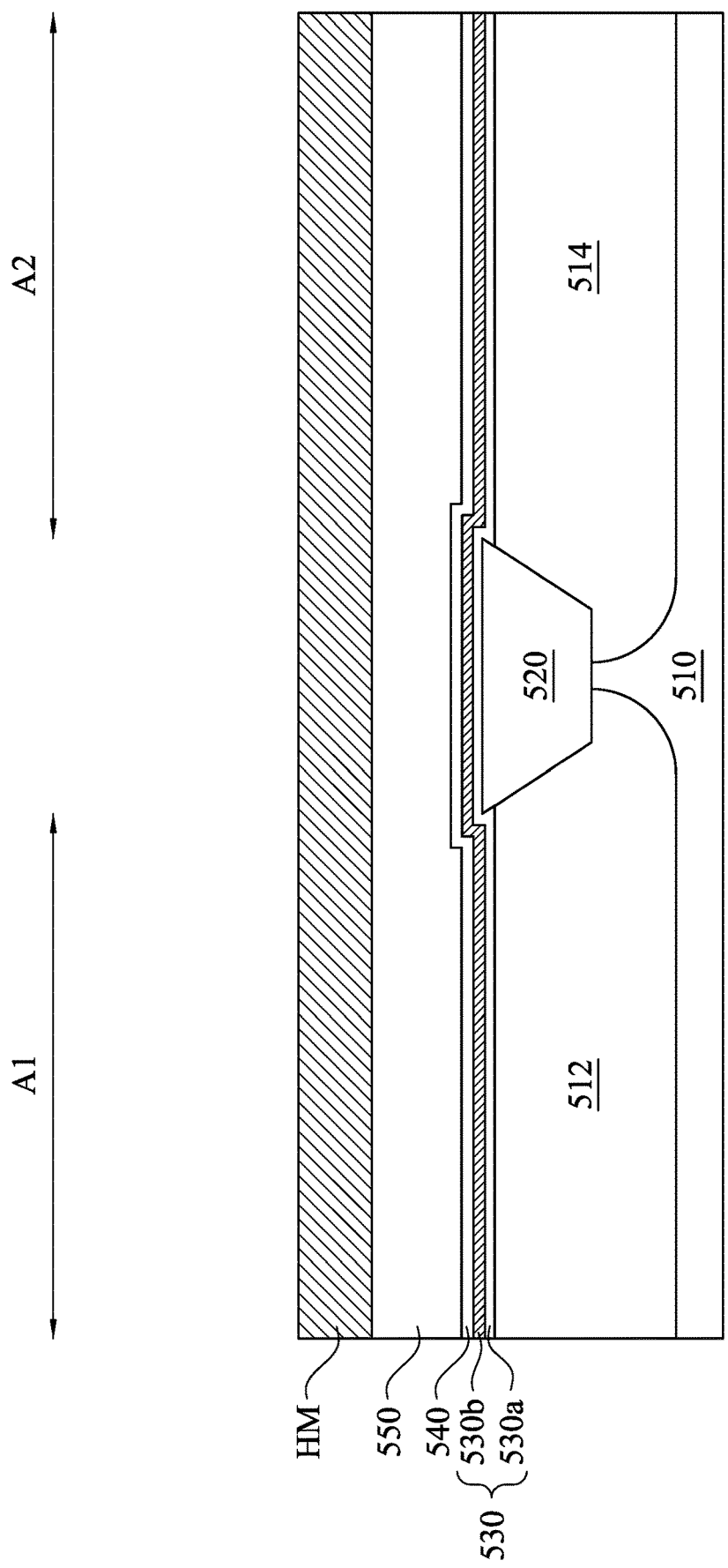

Reference is made to FIG. 3B. A gate dielectric layer 530, a barrier layer 540, and a dummy gate electrode layer 550 are formed over the semiconductor substrate 510 and the isolation structures 520. In some embodiments, the gate dielectric layer 530 may comprise silicon oxide, silicon oxynitride, high-k dielectric layer or combination thereof. For example, the gate dielectric layer 530 may include an oxide layer 530a and a high-k dielectric layer 530b over the oxide layer 530a. Examples of suitable high-k dielectric materials include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina (HfO$_2$—Al2O$_3$) alloy, and/or combinations thereof. The gate dielectric layer 530 may be grown by a thermal oxidation process, a chemical vapor deposition (CVD) process, an atomic layer deposition (ALD) process.

The barrier layer 540 is formed over the high-k dielectric layer. The barrier layer 540 may include titanium nitride or other suitable material. The barrier layer 540 may function as a barrier between the high-k dielectric layer 530b and a subsequently formed dummy poly gate structure to reduce or eliminate the risk of Fermi level pinning between the poly and the high-k dielectric layer 530b during subsequent processing. Further, the barrier layer 540 may also function as a stop layer for a subsequent etching process discussed below. The barrier layer 540 may be formed by various deposition techniques such as physical vapor deposition (PVD or sputtering), CVD, plating, or other suitable technique.

The dummy gate electrode layer 550 may be formed over the gate dielectric layer 530. In some embodiments, the dummy gate electrode layer 550 may comprise a single layer or multilayer structure. In the present embodiments, the dummy gate electrode layer 550 may comprise poly-silicon. Further, the dummy gate electrode layer 550 may be doped poly-silicon with the uniform or gradient doping. The dummy electrode layer 550 may be formed using a low-pressure chemical vapor deposition (LPCVD) process.

A hard mask layer HM is formed over the dummy gate electrode layer 550 to protect the dummy gate electrode layer 550 against subsequent etching process. The hard mask layer HM may include silicon nitride. The hard mask layer HM can be deposited by, for example, a CVD process, or a LPCVD process.

Figure 3C:
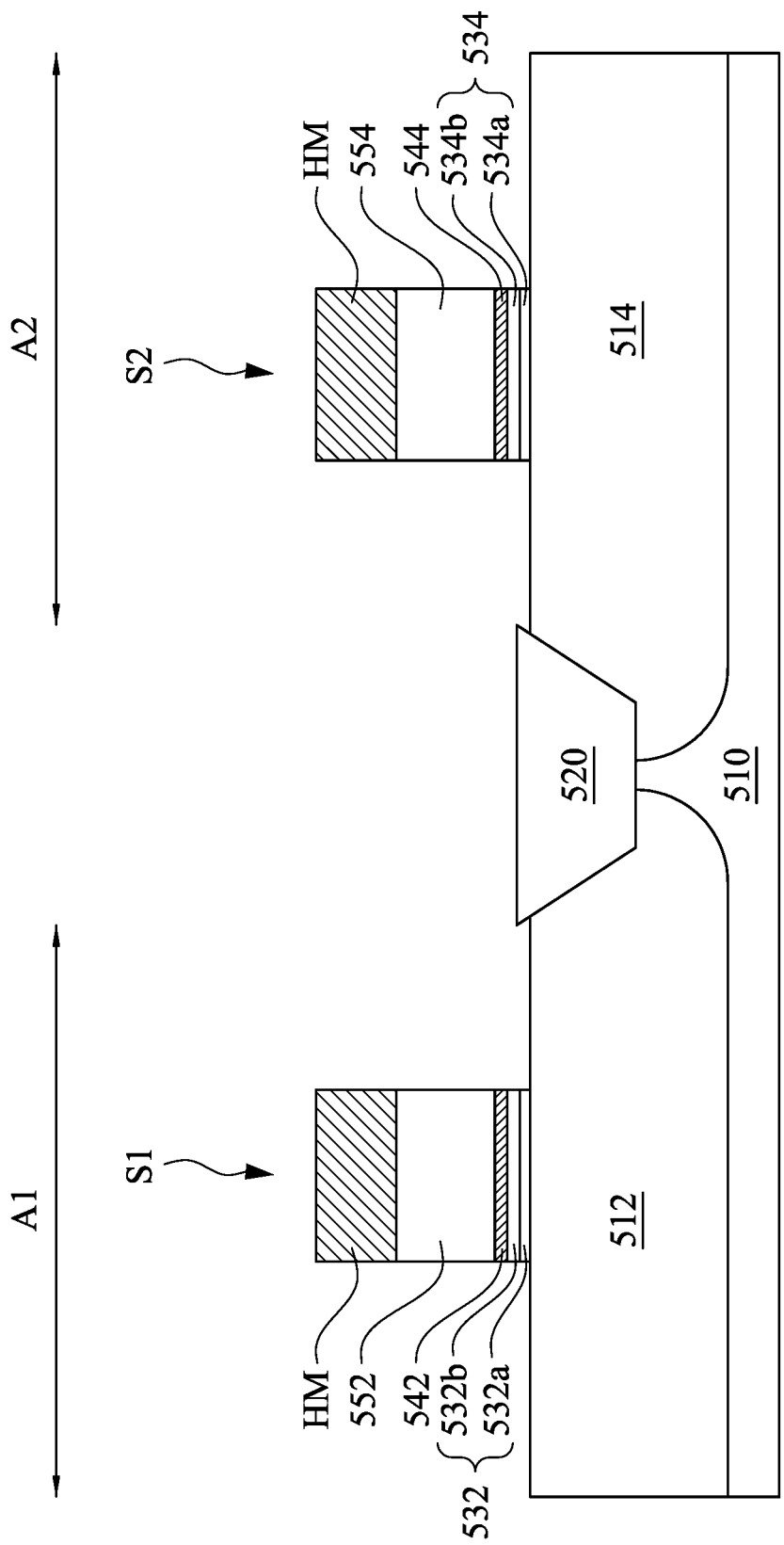

Reference is made to FIG. 3C. The hard mask layer HM is patterned using a photo-sensitive layer (not shown). Then, the dummy gate electrode layer 550, the barrier layer 540, and the gate dielectric layer 530 (referring to FIG. 3B) is patterned through the hard mask layer HM to form gate electrodes 552 and 554, barrier layer 542 and 544 and gate dielectrics 532 and 534. The patterning may include suitable etching process(es), such as using a reactive ion etching (RIE) or a high density plasma (HDP) process. The hard mask layer HM may have a higher etch resistance to the etching process than that of the dummy gate electrode layer 550 (referring to FIG. 3B), such that the gate electrodes 552 and 554, the barrier layer 542 and 544, and gate dielectrics 532 and 534 are protected by the hard mask layer HM, while portions of the dummy gate electrode layer 550, the barrier layer 540, and the gate dielectric layer 530 (referring to FIG. 3B) not covered by the hard mask layer HM may be etched away. The formed gate dielectric 532, the barrier layer 542, and the gate electrode 552 and the hard mask layer HM thereon form a stack S1, and the formed gate dielectric 534, the barrier layer 544, and the gate electrode 554 form a stack S2.

Figure 3D:
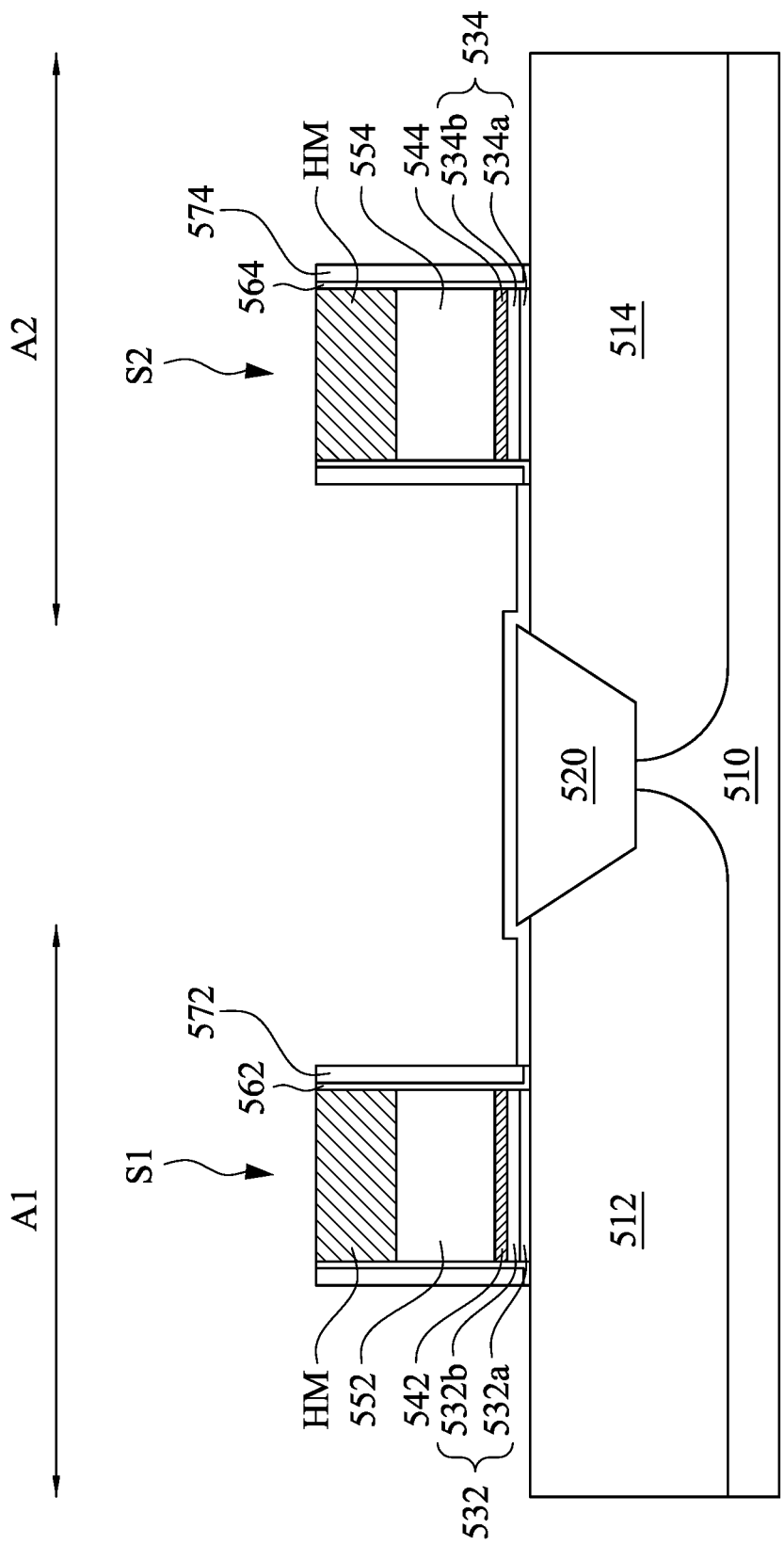

Reference is made to FIG. 3D. Oxygen-containing layers 562 and spacers 572 are deposited on opposite sidewalls of the stack S1, and oxygen-containing layers 564 and spacers 574 are deposited on opposite sidewalls of the stack S2. The oxygen-containing layers 562 and 564 may include silicon oxide or silicon oxynitride. The spacers 572 and 574 may include silicon nitride or carbon-doped silicon nitride. The formation of the oxygen-containing layers 562 and 564 and spacers 572 and 574 may include depositing an oxygen-containing layer and a spacer layer over the structure of FIG.

3C, and removing horizontal portions of the oxygen-containing layer and the spacer layer. The removal process may include one or more dry etching processes (e.g., anisotropic etching), thereby remaining portions of the oxygen-containing layer form the oxygen-containing layer 562 and 564, and remaining portions of the spacer layer form the spacers 572 and 574. It should be noted that the oxygen-containing layer 562, 564 and the spacers 572, 574 may prevent the stacks S1 and S2 from oxidation in further process steps. Also shown in FIG. 3D, after formation of the spacers 572 and 574, lightly doped source and drain (LDD) regions (not shown) may be formed in the substrate 510. This is accomplished via ion implantation of boron or phosphorous.

Figure 3E:
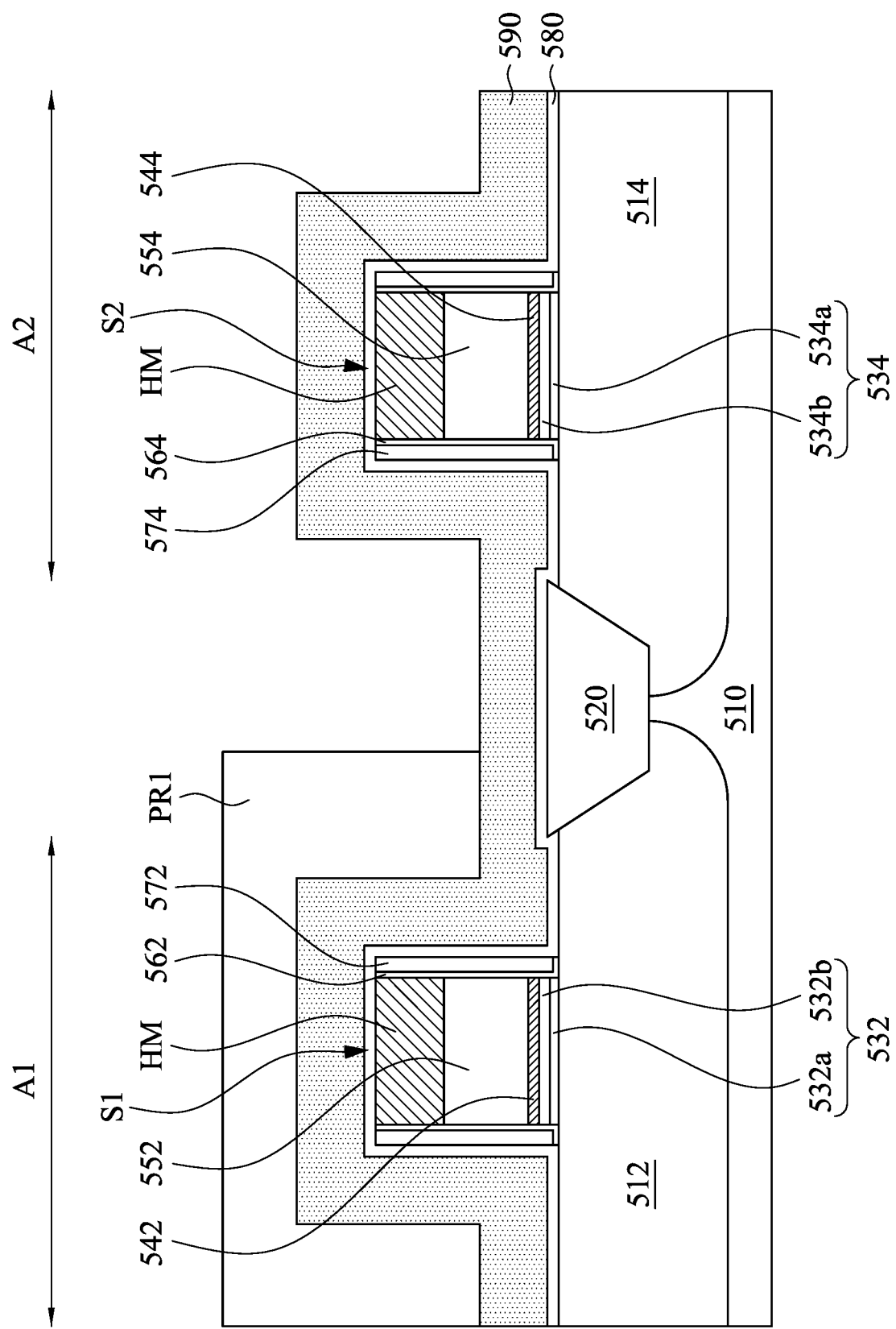

Reference is made to FIG. 3E. An oxygen-containing layer 580 and a spacer layer 590 may be deposited on the spacers 572, 574, the oxygen-containing layers 562, 564, and the stacks S1 and S2. The oxygen-containing layer 580 may comprise silicon oxide or silicon oxynitride. The oxygen-containing layer 580 can be deposited using a CVD or an ALD process. The spacer layer 590 is deposited on the oxygen-containing layer 580. The spacer layer 590 may include silicon nitride or carbon-doped silicon nitride. The spacer layer 590 may be deposited by the furnace apparatus 100 in FIG. 1A or the furnace apparatus 100' in FIG. 2A for processing plural wafers 301-310 (e.g., plural substrates 510) supported by the wafer boat 200 or 200'. Through the wafer boat 200/200', the densities of the spacer layers 590 on the wafers 301-310 (e.g., plural substrates 510) may be uniform. Furthermore, in some embodiments, the densities of the spacer layer 590 may be uniform on one of the wafers 301-310 (e.g., the substrate 510). In some embodiments, the step of depositing the oxygen-containing layer 580 and the step of depositing the spacer layer 590 may be performed in two different reactors.

After forming the oxygen-containing layer 580 and the spacer layer 590, a mask PR1 may be formed over the region A1 and exposing the region A2. The mask PR1 is for protecting the layers in the region A1 from subsequent etching process. The mask PR1 may be made of organic material. For example, the mask PR1 may be photoresist.

Figure 3F:
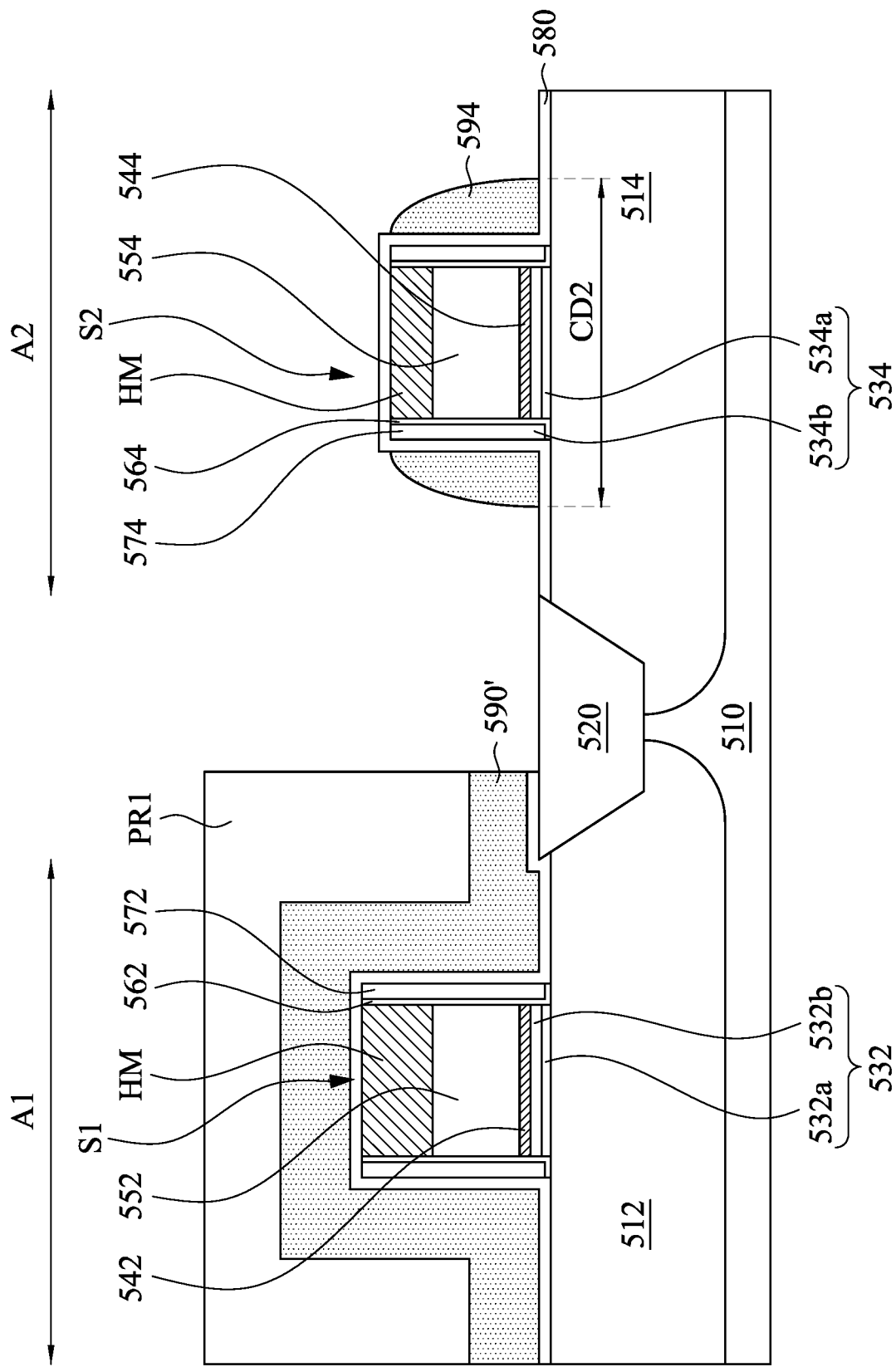

Reference is made to FIG. 3F. A dry etching process (e.g., anisotropic etching) is performed to remove horizontal portions of the spacer layer 590 (referring to FIG. 3E) in the region A2, and remain vertical portions of the spacer layer 590 (referring to FIG. 3E) on opposite sides of the stack S2 in the region A2. The dry etching process may have a high selectivity such that the dry etching process may stop at the oxygen-containing layer 580. For example, the dry etching process may be performed using BP, CH$_2$F$_2$, O$_2$, He, and Ar as etching gases. The remaining vertical portions of the spacer layer 590 in the region A2 forms spacers 594. In the present embodiments, the spacers 594 may define a critical dimension CD2 of a channel in the substrate 510, e.g., channel length, which may affect a drain saturation current (Id$_{sat}$) of the transistor to be formed. The mask PR1 protect a portion of the spacer layer 590 (referring to FIG. 3E) in the region A1 from being etched. After the etching process, the remaining portion of the spacer layer 590 (referring to FIG. 3E) in the region A1 is referred to as the spacer layer 590'.

Figure 4:
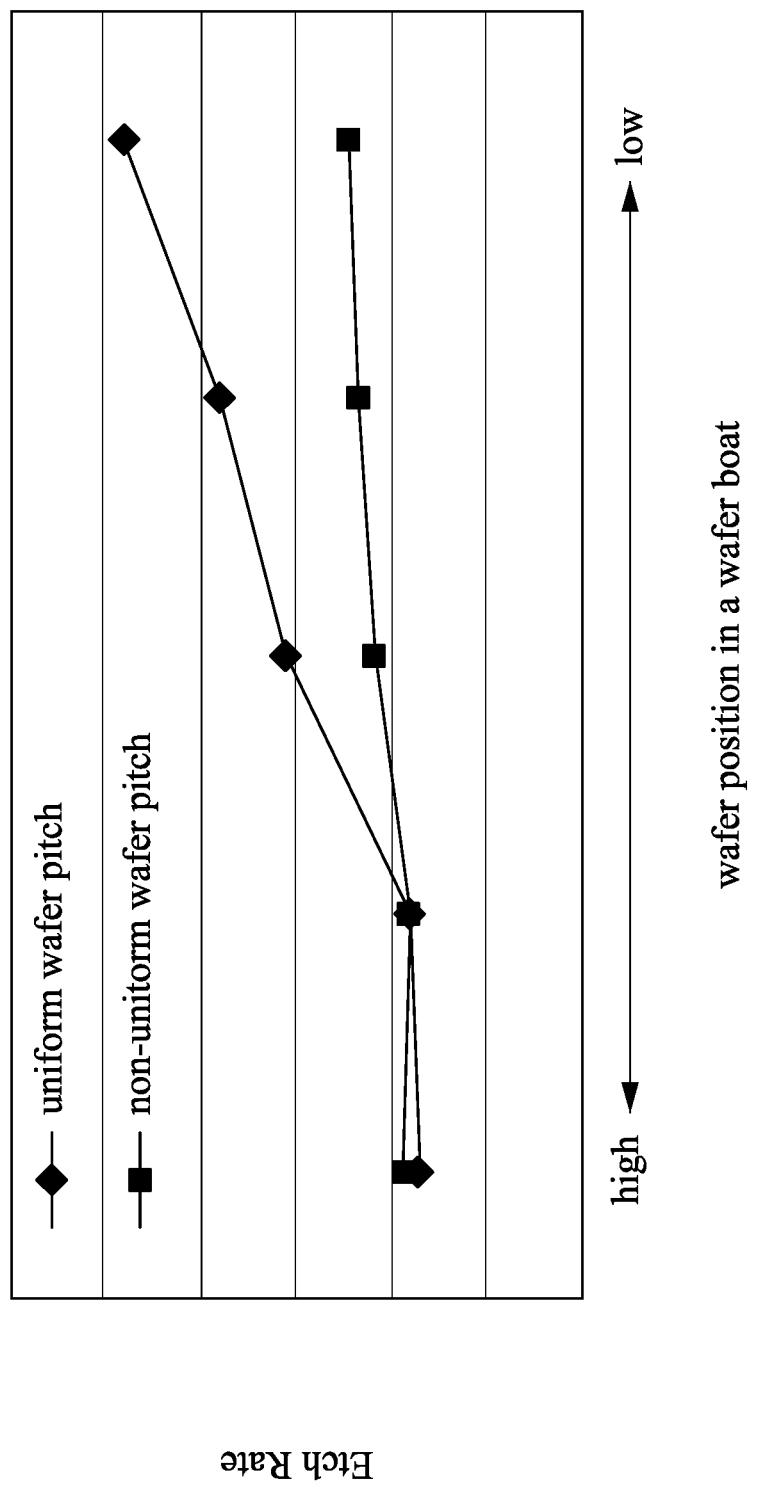
FIG. 4 shows etch rates of spacers of wafers at various positions of a wafer boat according to some embodiments of the present disclosure.

FIG. 4 shows etch rates of SiN spacer layers over wafers at various positions of a wafer boat according to some embodiments of the present disclosure. In some comparison cases where the wafers are separated by the same pitches, the spacer layers are formed with different densities, in which an etch rate of a spacer layer on the wafer at a lower position of the wafer boat may be higher than that of the wafer at a higher position thereof. The differences of etch rates may result in CD deviations, which may reduce drain saturation current (Id$_{sat}$) uniformity (IDU) measured at Wafer Acceptance Tests (WAT) on plural wafers.

In the present embodiments, through the wafer boat 200/200' (referring to FIGS. 1B to 2B), the pitches between the wafers in the wafer boat are designed to be varied for improving the concentration uniformity of the process gases during the CVD process, such that the densities of the spacer layers on the wafers 301-310 (e.g., plural substrates 510) are uniform. By using the design, etch rates of the spacer layers on wafers 301-310 (e.g., plural substrates 510) are substantially the same. Thus, the CD uniformity is improved, and thereby the IDU is also improved.

Figure 5:
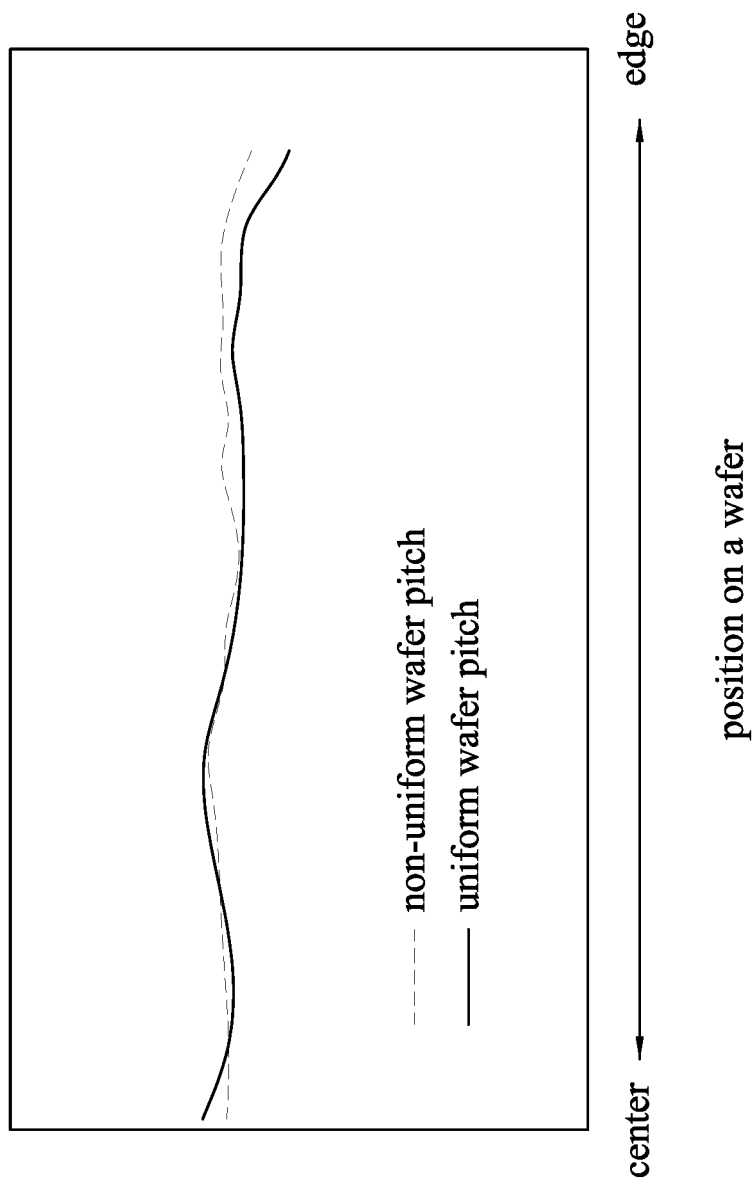
FIG. 5 shows saturation currents at various positions of a wafer according to some embodiments of the present disclosure.

FIG. 5 shows saturation currents at various positions of a wafer according to some embodiments of the present disclosure. In some comparison cases where the wafers are separated by the same pitches, rates of etching the spacer layers on the wafer vary from center to edge. The variation of etch rates may result in critical dimension (CD) deviations, which may reduce drain saturation current (Id$_{sat}$) uniformity (IDU) measured at a Wafer Acceptance Test (WAT) on the wafer, as shown by the solid line in FIG. 5. In the present embodiments, as shown by the dashed line in FIG. 5, the variation in the rates of etching the spacer layer on the wafer (e.g., on the substrate 510) is reduced by arranging wafers separated by the non-uniform pitch since the concentration uniformity of the process gases during the CVD process is improved. Thus, the CD uniformity is improved, and thereby the IDU is also improved.

Figure 3G:
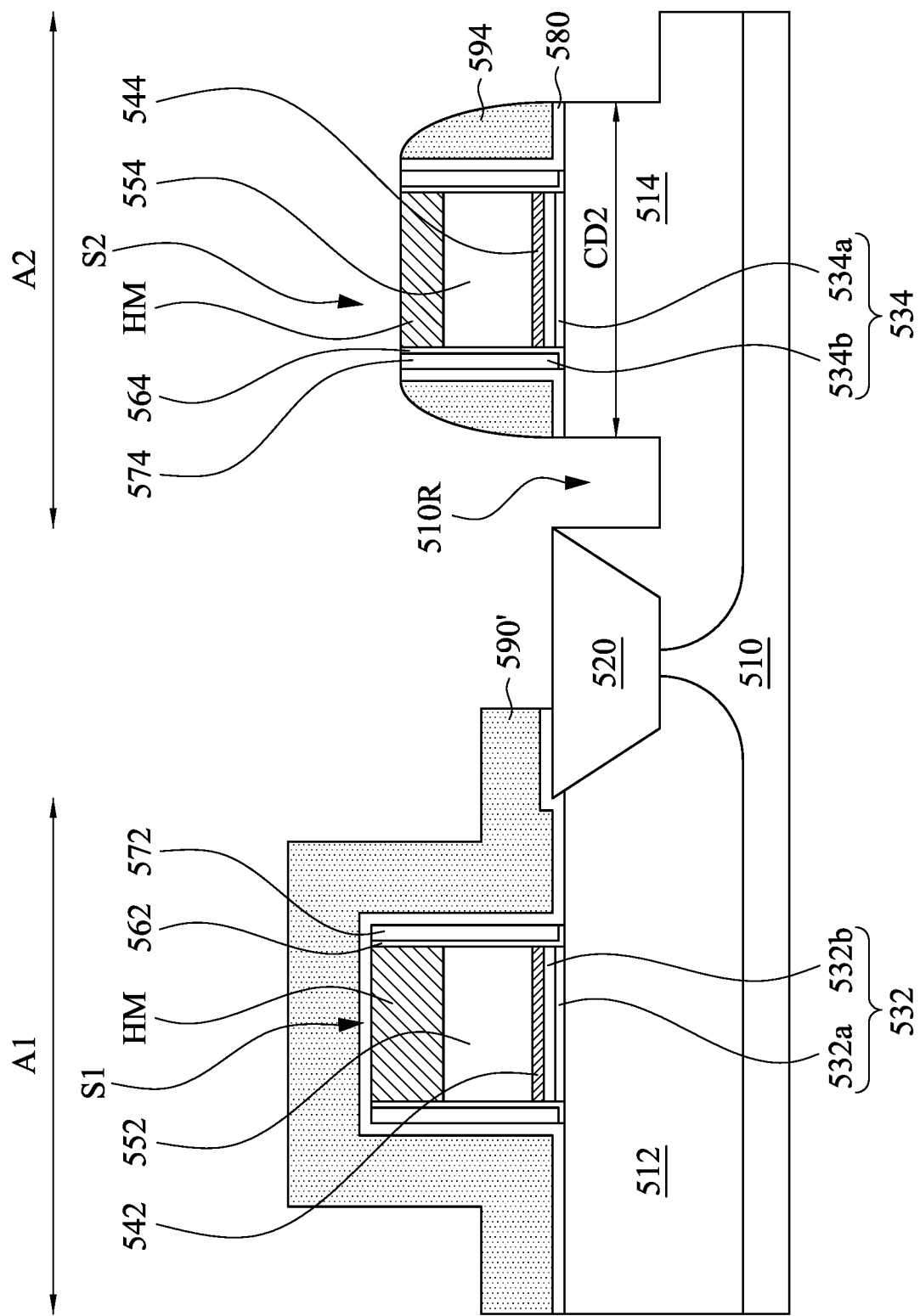

Reference is made to FIG. 3G. An etching process is performed to remove portions of the oxygen-containing layer 580 and the substrate 510 exposed by the spacers 594, such that recess 510R are formed in the substrate 510. The remaining portions of the oxygen-containing layer 580 form spacers. The etching process may be accomplished by a plasma etch using chlorine and bromine chemistry. The spacers 594 and the spacer layer 590' may have a higher etch resistance to the etching process than that of the oxygen-containing layer 580 and the substrate 510, such that the stack S2 and the elements in the region A1 are protected from being etched. After the etching process, an optional anneal may be performed to facilitate silicon migration to repair any etch damage as well as to slightly smoothen the silicon surface for the subsequent epitaxy process. In the present embodiments, the mask PR1 protect plural elements in region A1 from being etched in the previous etching processes, and is then stripped, to expose the region A1.

Figure 3H:
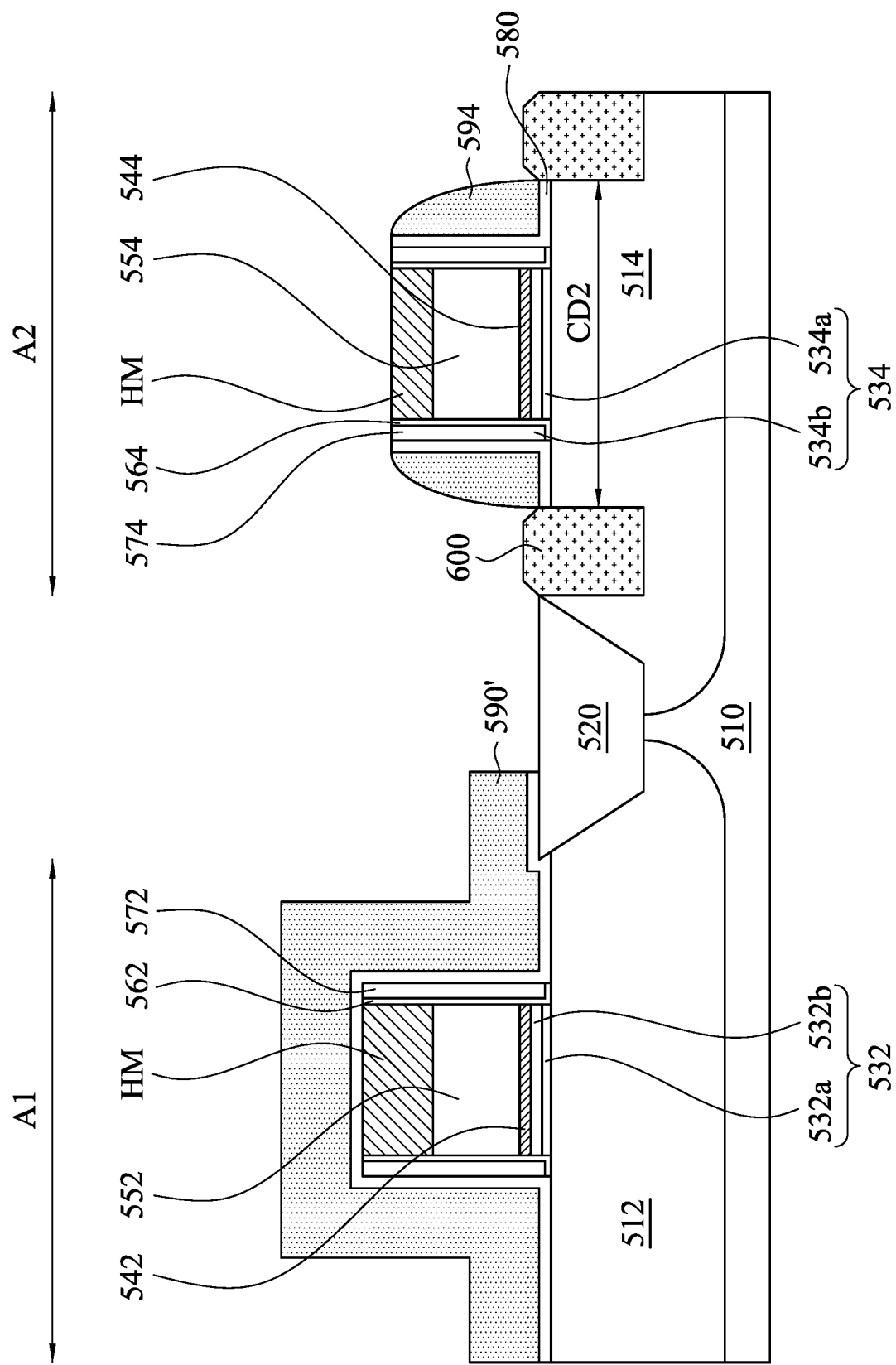

Reference is made to FIG. 3H. Source/drain features 600 are epitaxially grown to at least partially fill the recesses 510R. This can be accomplished using selective epitaxial growth. The epitaxy process used to perform the epitaxial growth may be chemical vapor deposition, ultra-high vacuum chemical vapor deposition (UHV-CVD), or molecular beam epitaxy. The source/drain features 600 may also extend above the surface of the substrate 510, forming a raised source and drain structure (not shown). In some embodiment, the source/drain features 600 include silicon germanium. The hard mask HM covers the top portion of the gate electrode 554 so that no epitaxial growth occurs on the gate electrode 554. The spacer 594 prevents epitaxial growth on sidewalls of the gate electrode 554.

The source/drain features 600 may be in-situ doped or undoped during the epitaxial growth. If undoped as grown, it may be doped subsequently and the dopants activated using a rapid thermal annealing process. The dopants may be introduced by ion implantation, plasma immersion ion implantation (PIII), gas or solid source diffusion, or any other techniques. Any implant damage or amorphization can be annealed through subsequent exposure to elevated temperatures.

Figure 3I:
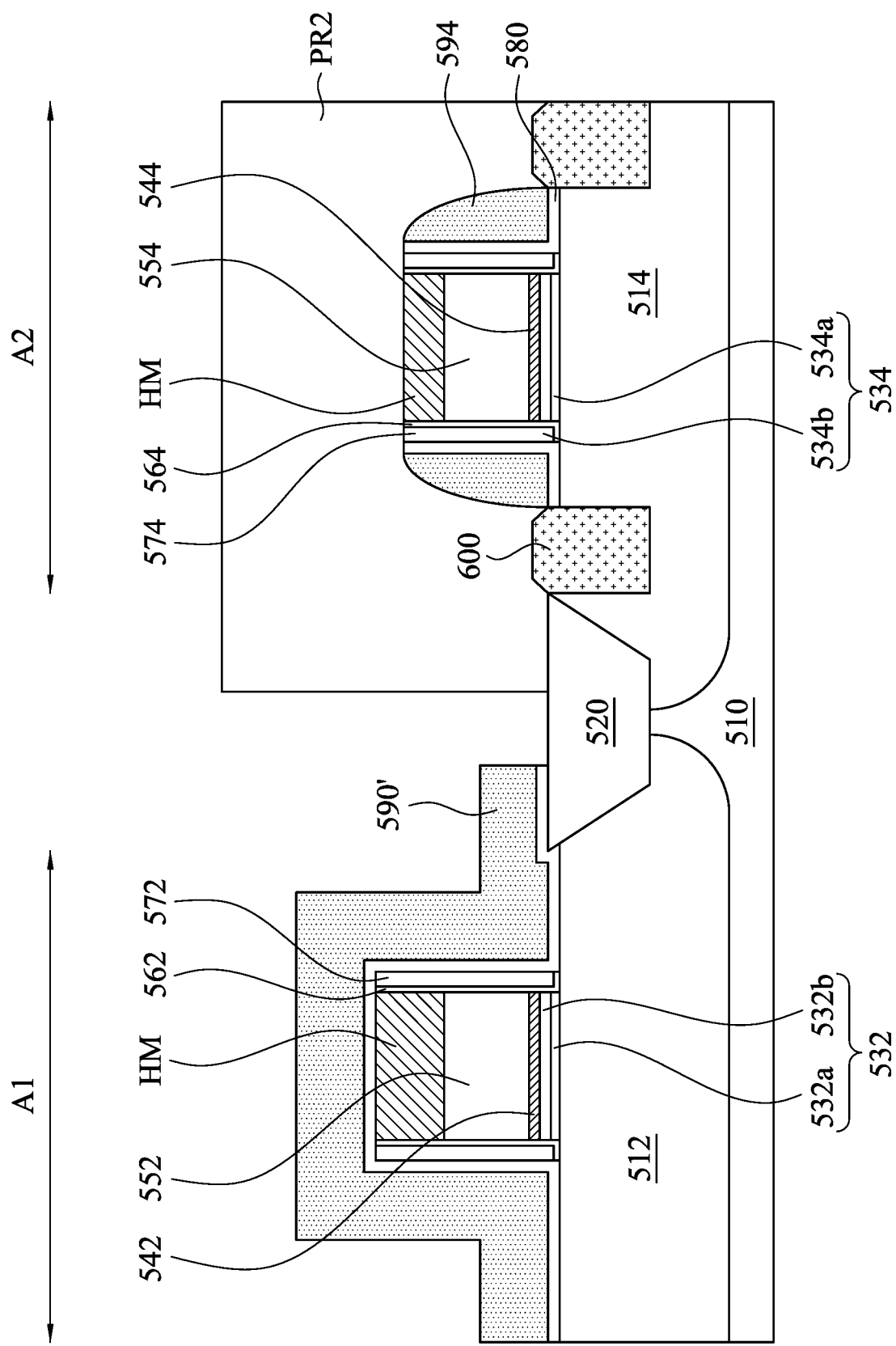

Reference is made to FIG. 3I. A mask PR2 may be formed over the region A2 and exposing the region A1. The mask PR2 is for protecting the elements in the region A2 from subsequent etching process. The mask PR2 may be made of organic material. For example, the mask PR2 may be photoresist.

Figure 3J:
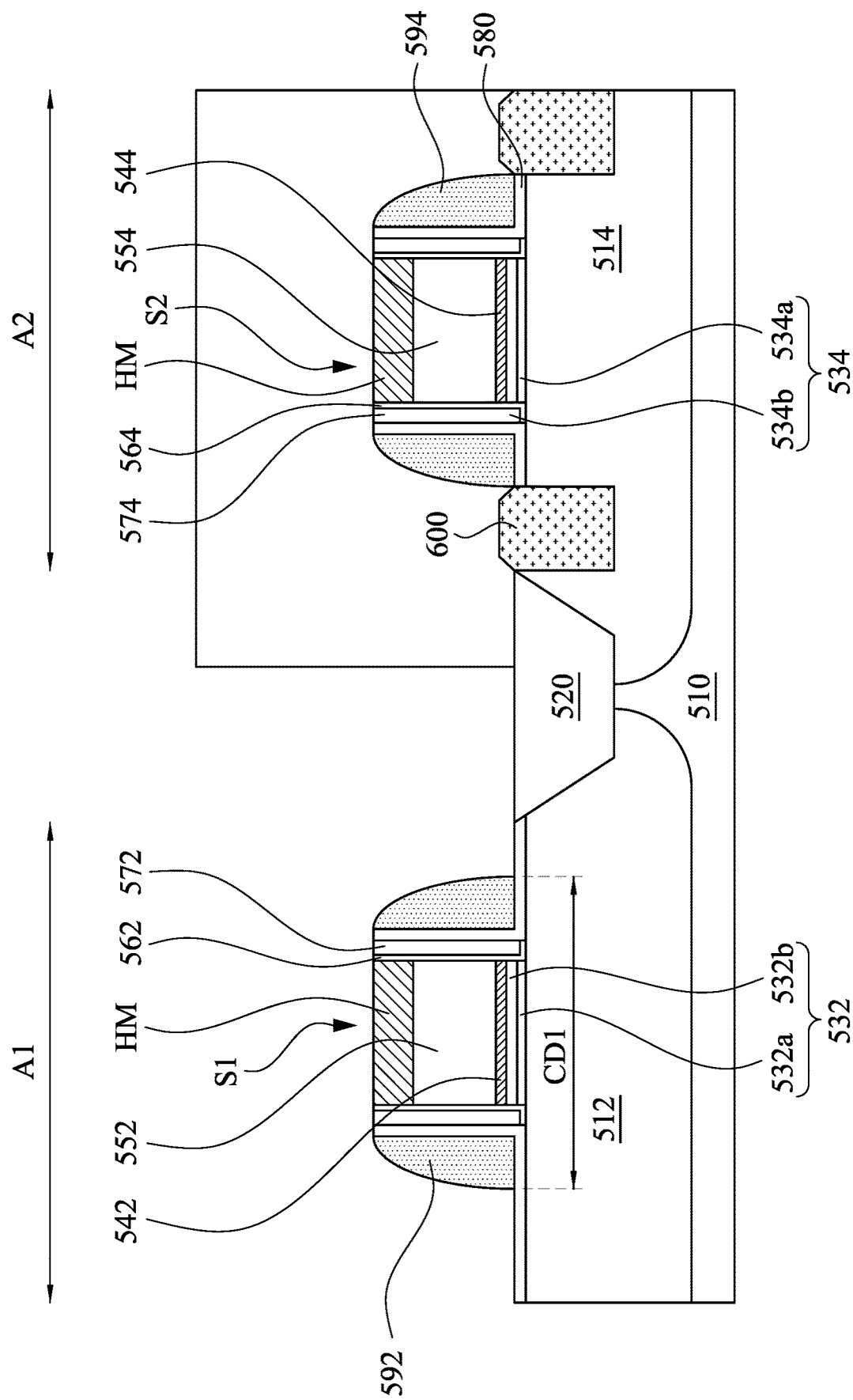

Reference is made to FIG. 3J. A dry etching process (e.g., anisotropic etching) is performed to remove horizontal portions of the spacer layer 590' (referring to FIG. 3I) in the region A1, and remain vertical portions of the spacer layer 590' (referring to FIG. 3I) on opposite sides of the stack S1 of the gate dielectric 532, the barrier layer 542, and the gate electrode 552. The dry etching process may have a high selectivity such that the dry etching process may stop at the oxygen-containing layer 580. For example, the dry etching process may be performed using BP, $CH_2F_2$, $O_2$, He, and Ar as etching gases. The remaining vertical portions of the spacer layer 590 forms spacers 592. In the present embodiments, the spacers 592 may define a critical dimension CD1 of a channel in the substrate 510, e.g., channel length, which may affect a drain saturation current ($Id_{sat}$) of the transistor to be formed.

As aforementioned in FIG. 3F, through the wafer boat 200/200' (referring to FIGS. 1A-2B), the pitches between the wafers are designed to be varied for improving the concentration uniformity of the process gases during the CVD process, such that the spacer layer on one of the wafers 301-310 (e.g., a substrate 510) or the spacer layers on plural wafers 301-310 (e.g., plural substrates 510) have reduced density variation. Through the design, rates of etching the spacer layers on wafers 301-310 (e.g., plural substrates 510) are substantially the same. Thus, the CD uniformity is improved, and thereby the IDU is also improved.

Figure 3K:
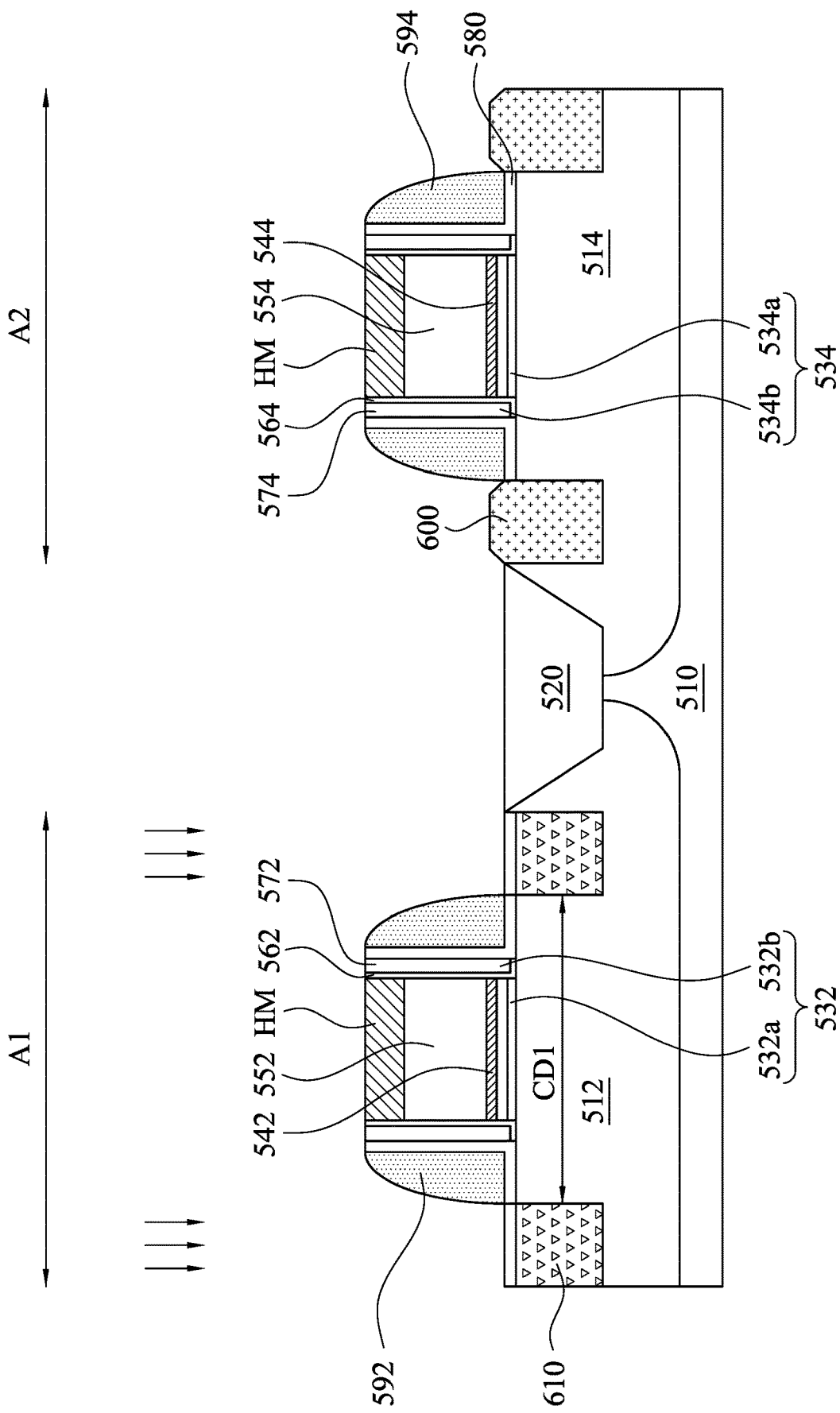

Reference is made to FIG. 3K. Doped regions 610 are formed in the substrate 510 using doping methods. The dopants may be introduced by ion implantation, plasma immersion ion implantation (PIII), gas or solid source diffusion, or any other techniques. Any implant damage or amorphization can be annealed through subsequent exposure to elevated temperatures.

Figure 3L:
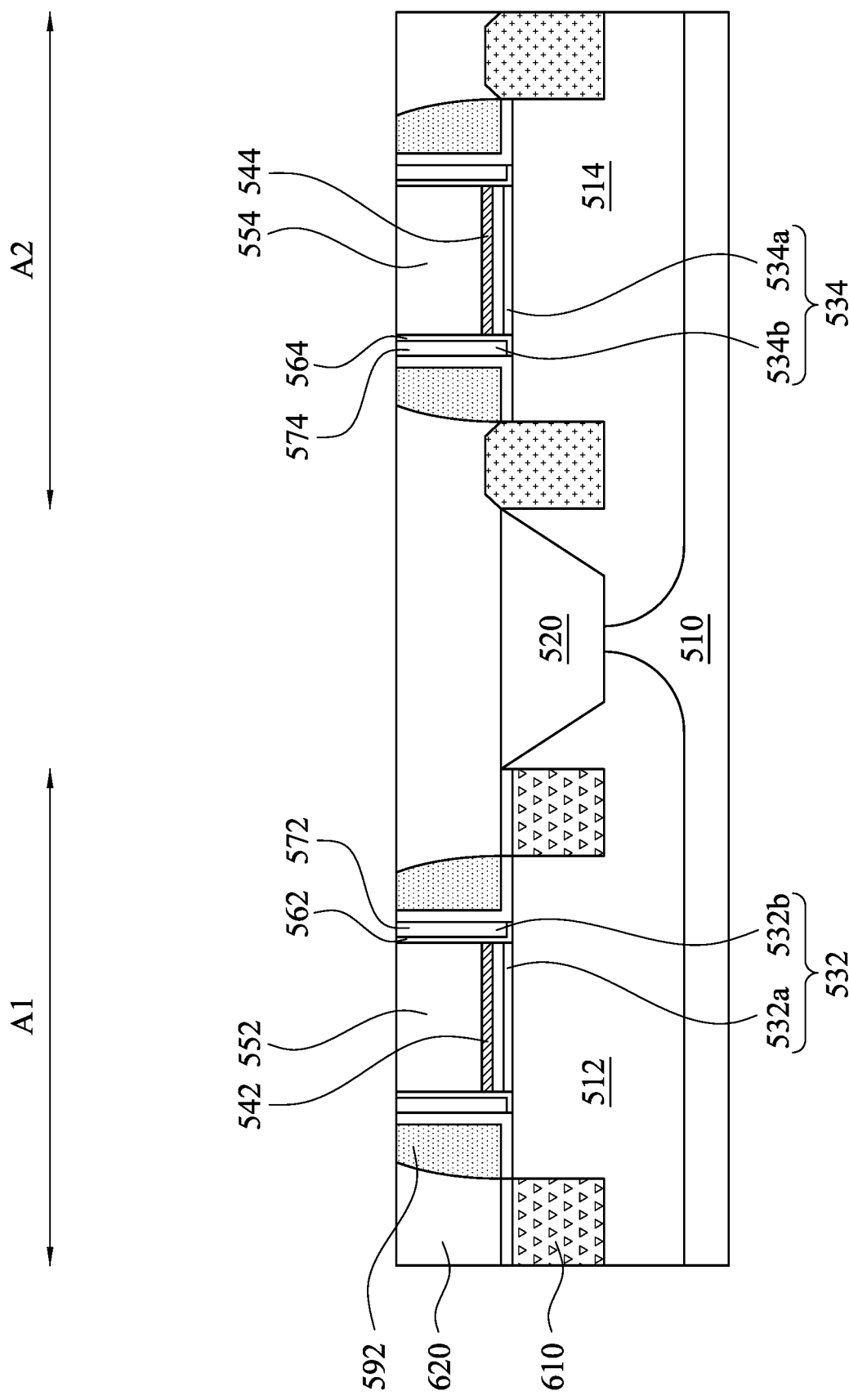

Reference is made to FIG. 3L. An inter-layer dielectric (ILD) 620 is formed over the structure of FIG. 3K. The formation of the ILD may include blanket forming an ILD layer to a height higher than a top surface of the hard masks HM, and removing excess portions of the ILD layer over the top surface of the hard masks HM. Accordingly, the gate stacks S1 and S2 are exposed by the ILD 620. The ILD 620 may include flowable oxide formed using, for example, flowable chemical vapor deposition (FCVD). The ILD 620 may also be a spin-on glass formed using spin-on coating. For example, the ILD 620 may include phospho-silicate glass (PSG), boro-silicate glass (BSG), boron-doped phospho-silicate glass (BPSG), tetraethyl orthosilicate (TEOS) oxide, TiN, SiOC, or other low-k non-porous dielectric materials. A chemical mechanical polish (CMP) is performed to remove the excess portions of the ILD layer over the top surface of the hard mask HM. In some embodiments, the hard masks HM are removed during the CMP, wherein the CMP stops on the top surface of the dummy gate electrode 552 and 554, such that the dummy gate electrode 552 and 554 are exposed.

Figure 3M:
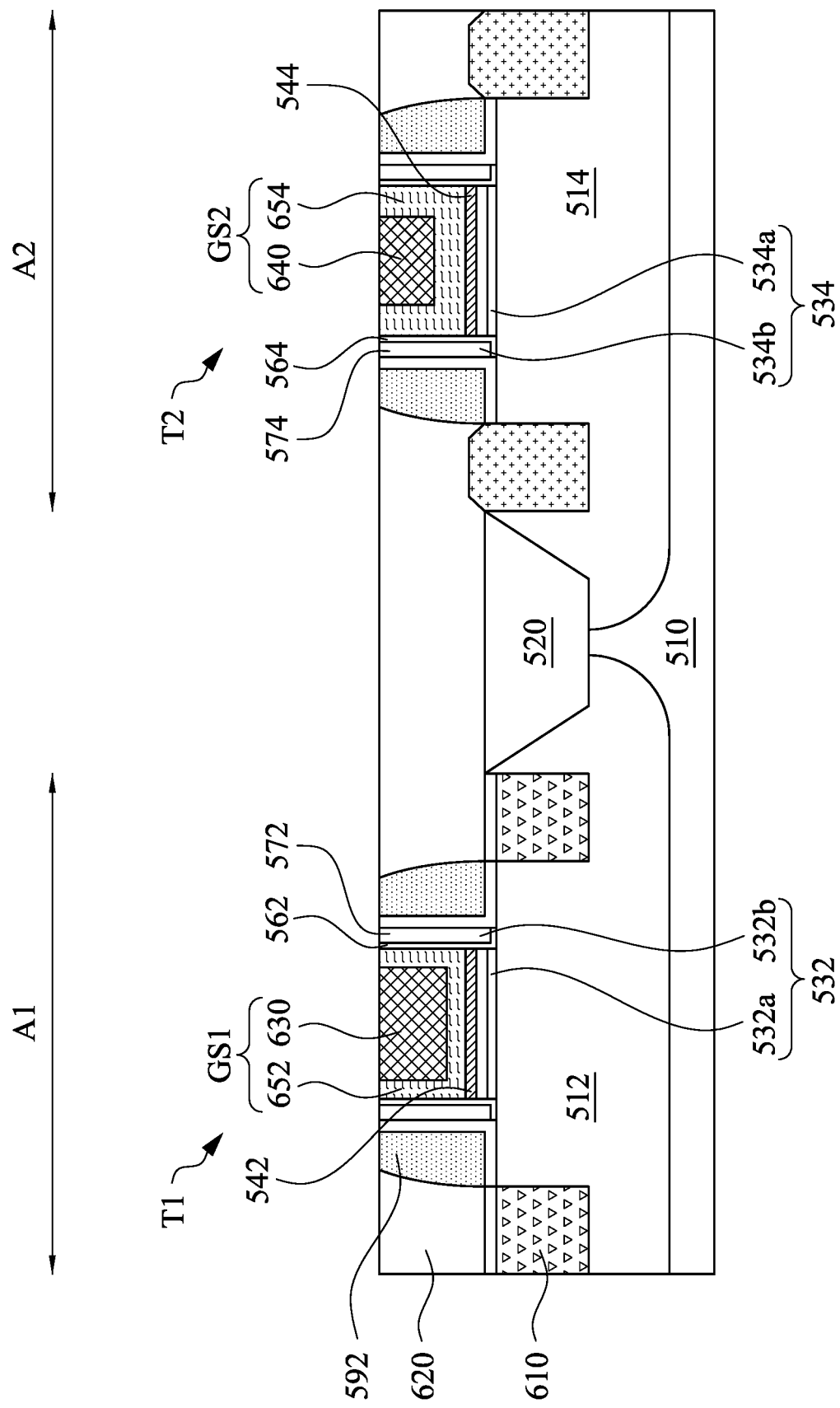

Reference is made to FIG. 3M. Replacement-gate processes are performed to the gate electrodes 552 and 554 (referring to FIG. 3I). The gate electrodes 552 and 554 (referring to FIG. 3I) are removed by one or more etch back processes, such as dry etch, wet etch, or other suitable process. For example, a wet etch process may include exposure to a hydroxide containing solution (e.g., ammonium hydroxide), deionized water, and/or other suitable etchant solutions. The barrier layers 542 and 544 may function as an etch stop layer in the etching process. The gate electrodes 552 and 554 (referring to FIG. 3I) may be selectively etched thereby forming gate trenches. Gate structure GS1 and GS2 are respectively formed in the gate trenches. Thus, a n-type transistor T1 and a p-type transistor T2 are formed in the regions A1 and A2, respectively.

For example, in the region A1, the gate electrode 552 (referring to FIG. 3I) is removed by an etching process to form a gate trench between the spacers 592, and a gate structure GS1 is formed in the gate trench. The gate structure GS1 may include a work function layer 630 and a gate conductor 652 over the work function layer 630. The n-type transistor T1 may include the gate structure GS1, the gate dielectric 532, the barrier layer 542, and the source/drain doped regions 610. In the region A2, the gate electrodes 554 is removed by an etching process to form a gate trench between the spacers 594, and a gate structure GS2 is formed in the gate trench. The gate structure GS2 may include a work function layer 640 and a gate conductor 654 over the work function layer 640. The p-type transistor T2 may include the gate structure GS2, the gate dielectric 534, the barrier layer 544, and the source/drain features 600.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the concentration of process gases in the reactive chamber gets uniform by tuning the pitches between the wafers, such that one or more deposited layers are formed with uniform densities. Another advantage is that CD uniformity on wafers is improved since the deposited layers have similar densities. Still another advantage is that CD uniformity on a wafer is improved since the deposited layer has uniform density.

According to some embodiments of the present disclosure, a wafer boat includes at least one support member, at least one set of at least one first fixture member, at least one set of at least one second fixture member, and at least one set of at least one third fixture member. The support member extends in a direction. The set of the first fixture member, the set of the second fixture member, and the set of the third fixture member are supported by the support member and sequentially arranged in the direction. The set of the first fixture member is separated from the set of the second fixture member by a first pitch, and the set of the second fixture member is separated from the set of the third fixture member by a second pitch, in which the first pitch is smaller than the second pitch.

According to some embodiments of the present disclosure, a furnace apparatus includes a processing vessel and a wafer boat. The processing vessel includes a reaction chamber, a gas inlet, and a gas outlet. The reaction chamber has a first end and a second end opposite to the first end of the reaction body. The gas inlet is at the first end of the reaction body. The gas outlet is at the second end of the reaction body. The wafer boat is in the reaction chamber. The wafer boat comprises a first fixture member, a second fixture member, and a third fixture member sequentially and separately arranged in a direction from the first end of the reaction chamber to the second end of the reaction chamber.

The first fixture member is separated from the second fixture member by a first pitch, the second fixture member is separated from the third fixture member by a second pitch, in which the first pitch is smaller than the second pitch.

According to some embodiments of the present disclosure, a method for forming a film includes sequentially placing a first wafer, a second wafer, and a third wafer in a chamber, wherein the first wafer is separated from the second wafer by a first pitch, and the second wafer is separated from the third wafer by a second pitch, and the first pitch is smaller than the second pitch; and introducing at least one process gas sequentially passing through the first wafer, the second wafer and the third wafer in the chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a film, the method comprising:
   sequentially placing a first wafer, a second wafer, and a third wafer in a chamber, wherein the first wafer is separated from the second wafer by a first distance, the second wafer is separated from the third wafer by a second distance, and the first distance is smaller than the second distance; and
   introducing at least one process gas sequentially passing through the first wafer, the second wafer and the third wafer in the chamber.

2. The method of claim 1, further comprising:
   heating the first wafer, the second wafer, and the third wafer to a temperature before or during introducing the process gas.

3. The method of claim 1, wherein introducing the process gas introduces the process gas through a gas inlet, wherein a first distance between the gas inlet and the first wafer is smaller than a second distance between the gas inlet and the second wafer.

4. The method of claim 1, wherein sequentially placing the first, second, and third wafers in the chamber is performed such that the first, second, and third wafers are respectively hold by first, second, and third fixture members, wherein the first fixture member is separated from the second fixture member by the first distance, and the second fixture member is separated from the third fixture member by the second distance.

5. The method of claim 1, further comprising:
   placing a fourth wafer in the chamber such that the first, second, third, and fourth wafer are sequentially placed, wherein the fourth wafer is separated from the third wafer by a third distance, and the second distance is substantially equal to the third distance.

6. The method of claim 1, further comprising:
   placing a fourth wafer in the chamber such that the first, second, third, and fourth wafer are sequentially placed, wherein the fourth wafer is separated from the third wafer by a third distance, and the second distance is smaller than the third distance.

7. A method, comprising:
   placing a first wafer, a second wafer, and a third wafer in a chamber, wherein the second wafer is higher than the first wafer, the third wafer is higher than the second wafer, and a first distance between the first wafer and the second wafer is smaller than a second distance between the second wafer and the third wafer; and
   causing at least one process gas flowing through the chamber to form a first layer over the first wafer, a second layer over the second wafer, and a third layer over the third wafer.

8. The method of claim 7, wherein a first space between the first wafer and the second wafer is free of wafers, and a second space between the second wafer and the third wafer is free of wafers.

9. The method of claim 7, wherein the chamber has a gas inlet, and placing the first to third wafers in the chamber is performed such that the first to third wafers are over the gas inlet.

10. The method of claim 7, wherein the chamber has a gas outlet, and placing the first to third wafers in the chamber is performed such that the first to third wafers are below the gas outlet.

11. The method of claim 7, wherein placing the first to third wafers in the chamber comprises loading a wafer boat holding the first to third wafers onto the chamber.

12. The method of claim 11, further comprising:
    unloading the wafer boat from the chamber after causing the process gas flowing through the chamber to form the first to third layers.

13. The method of claim 11, wherein loading the wafer boat comprises:
    supporting the wafer boat by a lid plate; and
    moving the lid plate to close an opening of the chamber.

14. A method, comprising:
    placing a first wafer, a second wafer, and a third wafer in a chamber, wherein the chamber has a gas inlet, the gas inlet is closer to the first wafer than the second wafer, the gas inlet is closer to the second wafer than the third wafer, and a first distance between the first wafer and the second wafer is smaller than a second distance between the second wafer and the third wafer; and
    causing at least one process gas flowing through the chamber to form a first layer over the first wafer, a second layer over the second wafer, and a third layer over the third wafer.

15. The method of claim 14, wherein a first space between the first wafer and the second wafer is free of wafers, and a second space between the second wafer and the third wafer is free of wafers.

16. The method of claim 14, wherein the chamber has a gas outlet, placing the first to third wafers in the chamber is performed such that the first to third wafers are between the gas inlet and the gas outlet.

17. The method of claim 14, wherein placing the first to third wafers in the chamber is performed such that the first to third wafers are horizontally arranged in the chamber.

18. The method of claim 14, wherein placing the first to third wafers in the chamber comprises loading a wafer boat onto the chamber.

19. The method of claim 18, further comprising:
    using the wafer boat to hold the first to third wafers prior to placing the first to third wafers in the chamber, wherein the wafer boat comprises first to third slots respectively receiving the first to third wafers, and a third distance between the first slot and the second slot is smaller than a fourth distance between the second slot and the third slot.

20. The method of claim 18, further comprising:
unloading the wafer boat from the chamber after causing the process gas flowing through the chamber to form the first to third layers.

* * * * *